US012777571B2

(12) United States Patent
Kazav et al.

(10) Patent No.: US 12,777,571 B2
(45) Date of Patent: Oct. 27, 2026

(54) DIRECT CONTACT HEAT TRANSFER COUPLINGS FOR PLUGGABLE NETWORK INTERFACE DEVICES

(71) Applicant: MELLANOX TECHNOLOGIES, LTD., Yokneam (IL)

(72) Inventors: Yaniv Kazav, Hadera (IL); Yuval Ullman, Beit Elazary (IL); Nimr Hazin, Bane (IL); Jamal Mousa, Haifa (IL); Bar Noyman, Kfar HaHoresh (IL); Ayal Shabtay, Parod (IL)

(73) Assignee: Mellanox Technologies, Ltd, Yokneam (IL)

( * ) Notice: Subject to any disclaimer, the term of this patent is extended or adjusted under 35 U.S.C. 154(b) by 329 days.

(21) Appl. No.: 18/367,094

(22) Filed: Sep. 12, 2023

(65) Prior Publication Data

US 2025/0089152 A1 Mar. 13, 2025

(51) Int. Cl.
*H05K 1/02* (2006.01)
*H05K 5/00* (2025.01)

(52) U.S. Cl.
CPC ......... *H05K 1/0203* (2013.01); *H05K 5/0047* (2013.01); *H05K 2201/066* (2013.01)

(58) Field of Classification Search
CPC ...... G02B 6/24; G02B 6/4236; G02B 6/4246; G02B 6/4267; G02B 6/4269; H04B 10/40; H01R 13/518; H01R 13/6581; H01R 13/6587; H01R 13/659; H01R 13/6594; H01R 13/665; H01R 12/7023; H01R 12/716; H01R 12/727; H01R 12/75; H05K 7/10; H05K 7/20; H05K 7/20127; H05K 7/20336; H05K 7/2039; H05K 7/20409; H05K 7/20418; H05K 7/2049; H05K 2201/06; H05K 2201/066; H05K 2201/10121; H05K 2201/10962; H05K 1/0201–0212; H05K 1/18; H05K 9/0016;

(Continued)

(56) References Cited

U.S. PATENT DOCUMENTS

| | | | | |
|---|---|---|---|---|
| 10,197,754 | B2 * | 2/2019 | Moore | H05K 7/20409 |
| 11,199,670 | B2 * | 12/2021 | Takai | G02B 6/4284 |
| 11,283,218 | B2 * | 3/2022 | Qiao | H01R 13/6592 |

(Continued)

OTHER PUBLICATIONS

Extended European Search Report for European Patent Application No. 26163133.7, dated Jun. 8, 2026, 12 pages.

*Primary Examiner* — Amir A Jalali
(74) *Attorney, Agent, or Firm* — Meitar Patents LTD.; Daniel Kligler

(57) ABSTRACT

A pluggable network interface device includes a printed circuit board ("PCB"), a housing, and a heatsink. The heatsink includes a first surface and a second surface, disposed opposite the first surface, that is maintained in direct contact with a surface of a heat-generating circuit of the PCB. The housing includes an outer shell defining an exterior of the housing, a receiving cavity disposed inside the outer shell, and an aperture extending through a first side of the outer shell from the exterior of the housing into the receiving cavity. A portion of the PCB and the second surface of the heatsink are disposed inside the receiving cavity while a portion of the heatsink extends from within the receiving cavity through the aperture arranging the first surface of the heatsink adjacent the exterior of the housing.

20 Claims, 11 Drawing Sheets

(58) Field of Classification Search
CPC .... H05K 9/0058; H05K 5/0286; H05K 3/301; H01L 23/4098
See application file for complete search history.

(56) References Cited

U.S. PATENT DOCUMENTS

| | | | | |
|---|---|---|---|---|
| 2005/0195565 | A1* | 9/2005 | Bright | H05K 7/20418 361/688 |
| 2007/0183128 | A1* | 8/2007 | Pirillis | H05K 9/0058 361/715 |
| 2011/0205711 | A1* | 8/2011 | Lischeck | H05K 7/20454 361/720 |
| 2018/0338387 | A1 | 11/2018 | Park et al. | |
| 2020/0015385 | A1* | 1/2020 | Bucher | G06F 1/20 |
| 2020/0137896 | A1* | 4/2020 | Elenitoba-Johnson | G06F 13/409 |
| 2020/0221607 | A1 | 7/2020 | Bucher | |
| 2020/0257067 | A1* | 8/2020 | Meunier | G02B 6/4269 |
| 2021/0105025 | A1* | 4/2021 | Wall, Jr. | G02B 6/4269 |
| 2022/0003946 | A1* | 1/2022 | Edwards, Jr. | G02B 6/4268 |
| 2022/0158390 | A1* | 5/2022 | Lee | H01R 13/6594 |
| 2022/0252800 | A1* | 8/2022 | Myhre | H04B 1/036 |
| 2022/0302651 | A1* | 9/2022 | Long | H01R 13/6581 |
| 2022/0360004 | A1* | 11/2022 | Mousa | H01R 13/533 |
| 2024/0126028 | A1* | 4/2024 | Mousa | G02B 6/4246 |
| 2024/0206127 | A1* | 6/2024 | Leung | G02B 6/4269 |

* cited by examiner

DIRECT CONTACT HEAT TRANSFER COUPLINGS FOR PLUGGABLE NETWORK INTERFACE DEVICES

BACKGROUND

The present disclosure is generally directed to networking cable assemblies and relates more particularly to pluggable network interface devices.

Datacenters are the storage and data processing hubs of the Internet. Cable assemblies are used to interconnect network devices and/or network switches within a datacenter to enable high-speed communication between the network switches.

BRIEF SUMMARY

Aspects of the present disclosure include a pluggable network interface device including a printed circuit board ("PCB"), a housing, and a heatsink. The heatsink includes a first surface and a second surface, disposed opposite the first surface, that is maintained in direct contact with a surface of a heat-generating circuit of the PCB. The housing includes an outer shell defining an exterior of the housing, a receiving cavity disposed inside the outer shell, and an aperture extending through a first side of the outer shell from the exterior of the housing into the receiving cavity. A portion of the PCB and the second surface of the heatsink are disposed inside the receiving cavity while a portion of the heatsink extends from within the receiving cavity through the aperture arranging the first surface of the heatsink adjacent the exterior of the housing.

In one embodiment, a pluggable network interface device is provided that includes a PCB comprising at least one heat-generating circuit package; a heatsink comprising a first surface and a second surface disposed opposite the first surface, the first surface being offset a thickness from the second surface, and the second surface arranged in direct contact with an outer surface of the at least one heat-generating circuit package; and a housing comprising: an outer shell defining an exterior of the housing; a receiving cavity disposed inside the outer shell; and an aperture extending through a first side of the outer shell from the exterior of the housing into the receiving cavity; wherein a portion of the PCB and the second surface of the heatsink are both disposed inside the receiving cavity, and wherein a portion of the heatsink extends from within the receiving cavity through the aperture arranging the first surface of the heatsink adjacent the exterior of the housing.

In an illustrative embodiment, a pluggable network interface module includes a split-shell housing running a first length from a first end of the split-shell housing to a second end of the split-shell housing, the split-shell housing comprising: a first shell portion extending the first length and comprising a first cavity running along a portion of the first length; a second shell portion extending the first length and comprising a second cavity running along a portion of the first length, wherein the first shell portion is joined to the second shell portion, and wherein the first cavity and the second cavity together form a receiving cavity for the split-shell housing; and an aperture extending through a first side of the first shell portion from the receiving cavity to an exterior of the split-shell housing; a circuit substrate disposed at least partially within the receiving cavity, the circuit substrate comprising at least one heat-generating element; and a heatsink comprising a first surface and a second surface disposed opposite the first surface, the first surface being offset a thickness from the second surface, and the second surface arranged in direct contact with an outer surface of the at least one heat-generating element, wherein the second surface of the heatsink is disposed inside the receiving cavity, and wherein a portion of the heatsink extends from within the receiving cavity through the aperture arranging the first surface of the heatsink adjacent the exterior of the first shell portion of the split-shell housing.

In an illustrative embodiment, a pluggable network interface module includes a split-shell housing running a first length from a first end of the split-shell housing to a second end of the split-shell housing, the split-shell housing comprising: a first shell portion extending the first length and comprising a first cavity running along a portion of the first length; a second shell portion extending the first length and comprising a second cavity running along a portion of the first length, wherein the first shell portion is joined to the second shell portion, and wherein the first cavity and the second cavity together form a receiving cavity for the split-shell housing; and an aperture extending through a first side of the first shell portion from the receiving cavity to an exterior of the split-shell housing; a circuit substrate disposed at least partially within the receiving cavity, the circuit substrate comprising at least one heat-generating element; a heatsink comprising a first surface and a second surface disposed opposite the first surface, the first surface being offset a thickness from the second surface, and the second surface arranged in direct contact with an outer surface of the at least one heat-generating element, wherein the second surface of the heatsink is disposed inside the receiving cavity, and wherein a portion of the heatsink extends from within the receiving cavity through the aperture arranging the first surface of the heatsink adjacent the exterior of the first shell portion of the split-shell housing; and a spring arranged in contact with the heatsink, the spring maintaining the direct contact between the second surface of the heatsink and the outer surface of the at least one heat-generating element.

Numerous additional features and advantages are described herein and will be apparent to those skilled in the art upon consideration of the following Detailed Description and in view of the figures.

BRIEF DESCRIPTION OF THE SEVERAL VIEWS OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

DETAILED DESCRIPTION

Figure 1A:
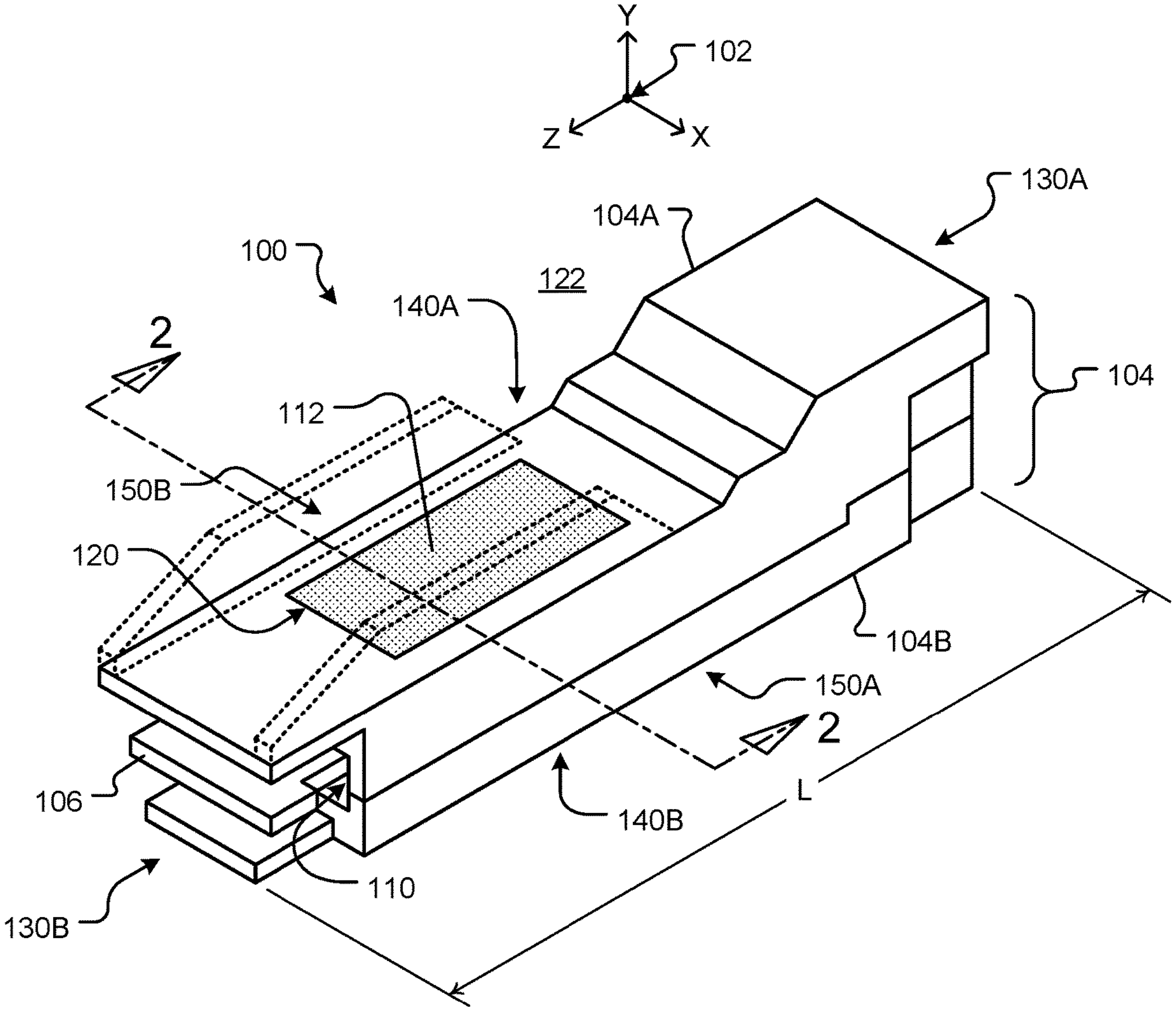
FIG. 1A shows a perspective view of a pluggable network interface device in accordance with embodiments of the present disclosure.

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the present disclosure may use examples to illustrate one or more aspects thereof. Unless explicitly stated otherwise, the use or listing of one or more examples (which may be denoted by "for example," "by way of example," "e.g.," "such as," or similar language) is not intended to and does not limit the scope of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that may be schematic illustrations of idealized configurations.

Pluggable network interface devices, or pluggable network interface modules, generally include a PCB, or circuit substrate, that is at least partially embedded in a housing. Each pluggable network interface device includes at least one heat-generating circuit package such as a clock and data recovery circuit ("CDR"), microcontroller, driver, chips, and/or other circuitry attached to the PCB that generates heat during use, or while in operation. As can be appreciated, the efficient dissipation of heat is critical to ensuring proper operation. For instance, in certain pluggable network interface devices, like Extended Detection and Response ("XDR") transceivers, the device's total power can reach about 35 Watts, and the CDR component alone can reach up to 25 Watts. Consuming this amount of power, especially in small form factor pluggable devices, naturally generates high temperatures and thermal energy (e.g., temperatures at or around 121° C., etc.).

Conventional heat transfer solutions generally rely on convection and/or conduction cooling methods. To provide this type of cooling a heatsink may be used to enhance the transfer of heat away from the heat-generating components (e.g., heat-generating circuit package, etc.). Most heatsinks are arranged close to heat-generating components to aid in the transfer of heat. Whenever two mechanical parts needs are arranged close to one another as part of a thermal solution there is a thermal challenge. For example, due to certain tolerancing limitations, the heatsink must typically be offset from the surfaces of the heat-generating components and, as such, a gap is formed between the heatsink and the heat-generating components. In an attempt to compensate for the gap, a thermal interface material ("TIM"), or thermally conductive material, may be applied between the heat-dissipating device (e.g., the heatsink) and the heat-producing device (e.g., the heat-generating components). Since the TIM must be able to fill the gap and contact the heatsink and the heat-generating components, the TIM may be polymer, paste, conductive pad, or other compliant material to accommodate the variations in gap size. However, when the mechanical gap is large, the TIM thickness increases and the thermal transfer provided by the TIM decreases and becomes less effective.

By way of example, the thermal resistance ($R_{th}$) of a typical component-to-component interface, for conduction, may be defined as the thermal resistance of the materials in contact ($R_{contact}$) plus the thermal resistance associated with the TIM ($R_{TIM}$). The $R_{TIM}$, may be defined as the gap distance (L) divided by the product of the cross-sectional area perpendicular to the path of heat flow (A) multiplied by the thermal conductivity (k) of the TIM. As can be appreciated, the higher the value of the $R_{th}$, the higher the gradient and poorer the thermal solution, which results in higher component temperatures of the components. On the other hand, the lower the value of the $R_{th}$, the lower the gradient and better the thermal solution, which results in lower component temperatures. As the $R_{TIM}$ increases (e.g., by increasing the gap distance (L), or overall size of the gap), the larger the value of the $R_{th}$. The present disclosure, however, describes arranging the heatsink and the heat-generating circuit package in direct contact with one another thereby eliminating the gap completely. In this manner, the gap distance is zero and, as such, the $R_{TIM}$ is zero. Therefore, the $R_{th}$ equals the $R_{contact}$ only and provides a lower thermal resistance and a lower gradient, which results in lower component temperatures for the pluggable network interface devices presently described. Stated another way, the temperatures observed from an indirect contact solution (e.g., of about 120° C.) may be reduced to much lower temperatures (e.g., of about 100° C., or lower, plus or minus 10° C., etc.).

As described herein, the pluggable network interface devices, or modules, may be configured with a suitable form factor, for example, a small form factor pluggable ("SFP"), SFP+, quad SFP ("QSFP"), QSFP+, QSFP-double density ("QSFP-DD"), octal SFP ("OSFP"), and/or the like.

It is with respect to the above issues and other problems that the embodiments presented herein were contemplated. Among other things, the present disclosure provides pluggable network interface devices that arrange the heatsink in direct contact with the heat-generating circuit package and that are capable of providing a significant improvement in the ability to conduct heat while using a variety of heat transfer systems (e.g., air cooling, liquid cooling, convection cooling, conduction cooling, combinations thereof, and/or the like). Moreover, the pluggable network interface devices described herein provide the additional benefit of offering direct contact heat transfer solution in an integrated package that conforms with current OSFP specifications and dimensional requirements (e.g., without deviating from the standard predefined sizes set for OSFP devices).

Figure 1B:
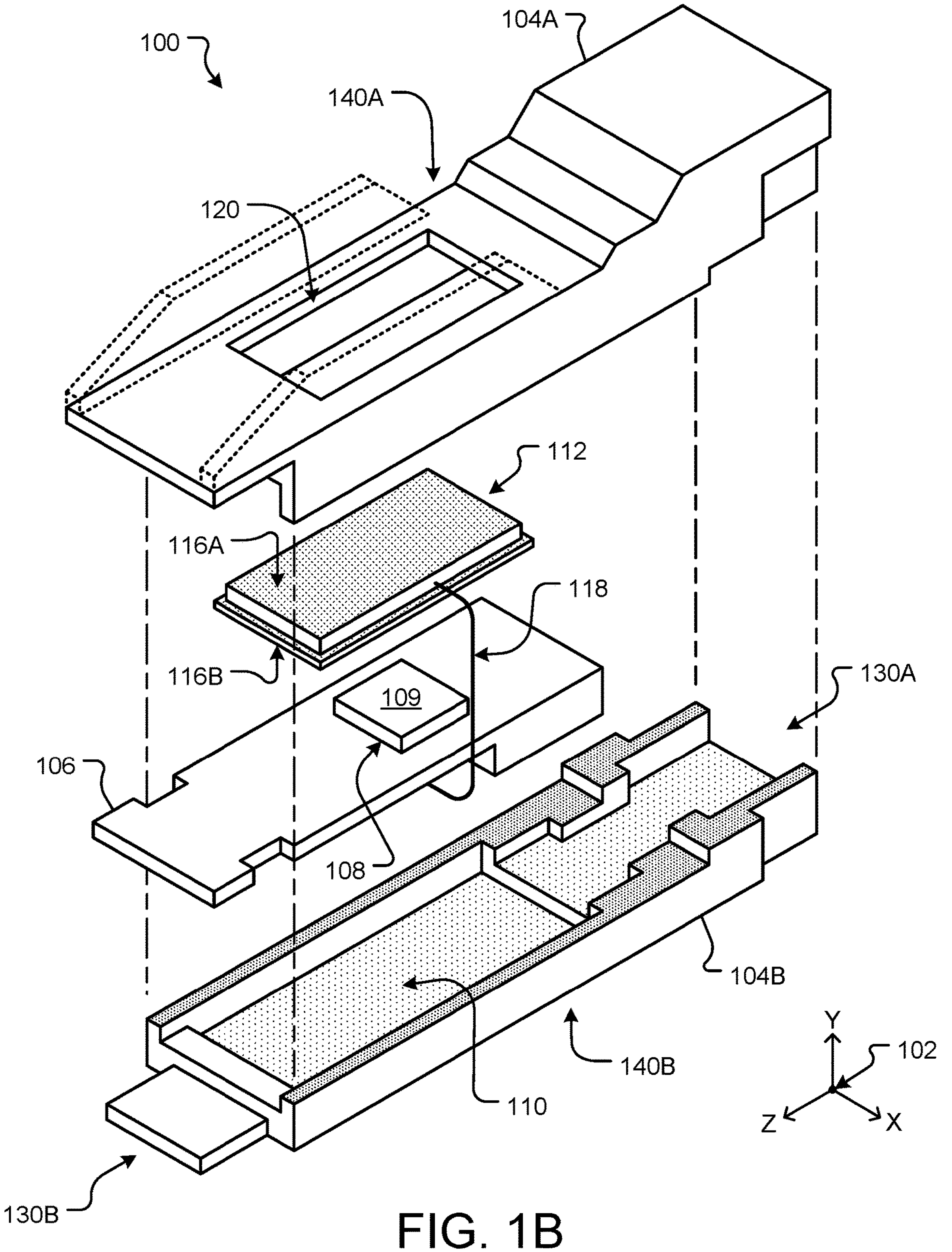
FIG. 1B shows an exploded perspective view of a pluggable network interface device in accordance with embodiments of the present disclosure.

Referring initially to FIGS. 1A-1B, perspective views of a pluggable network interface device 100 are shown in accordance with embodiments of the present disclosure. The pluggable network interface device 100 includes a housing 104, a circuit substrate 106 (e.g., a PCB, etc.) with at least one heat-generating circuit package 108, and a heatsink 112 that is arranged in direct contact with the heat-generating circuit package 108. In some embodiments, the pluggable network interface device 100 may be referred to as a pluggable network interface module. The pluggable network interface device 100 may comprise one or more cables. The cables may comprise one or more copper cables, one or more fiber optic cables, and/or any other suitable cable for transmitting and/or receiving data. In a scenario where the cables include fiber optic cables, the pluggable network interface device 100 may include optical transceivers that convert electrical signals into optical signals and optical signals into electrical signals. In one non-limiting example, the pluggable network interface device 100 may comprise a direct attach cable ("DAC") cable assembly with an OSFP connector form factor. Details of the pluggable network interface device 100 are discussed in more detail below with reference to the figures.

Features of the pluggable network interface device 100 may be described in conjunction with a coordinate system 102. The coordinate system 102, as shown in FIGS. 1A-1B, includes three-dimensions comprising an X-axis, a Y-axis, and a Z-axis. Additionally or alternatively, the coordinate system 102 may be used to define planes (e.g., the XY-plane, the XZ-plane, and the YZ-plane) of the pluggable network interface device 100. These planes may be disposed orthogonal, or at 90 degrees, to one another. While the origin of the coordinate system 102 may be placed at any point on or near the components of the pluggable network interface device 100, for the purposes of description, the axes of the coordinate system 102 are always disposed along the same directions from figure to figure, whether the coordinate system 102 is shown or not. In some examples, reference may be made to dimensions, angles, directions, relative positions, and/or movements associated with one or more components of the pluggable network interface device 100 with respect to the coordinate system 102. For example, the width of the pluggable network interface device 100 (e.g., running from the first width side 150A to the second width side 150B of the pluggable network interface device 100) may be defined as a dimension along the X-axis of the coordinate system 102, the height of the pluggable network interface device 100 may be defined as a dimension along the Y-axis of the coordinate system 102, and the length, L, of the pluggable network interface device 100 may be defined as a dimension along the Z-axis of the coordinate system 102.

Although not explicitly illustrated, it should be appreciated that the pluggable network interface device 100 may include processing circuitry and/or memory for carrying out computing tasks, for example, tasks associated with controlling the flow of data over a communication network. The processing circuitry may comprise software, hardware, or a combination thereof. For example, the processing circuitry may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include flash memory, Random Access Memory ("RAM"), Read Only Memory ("ROM"), variants thereof, combinations thereof, or the like. In some embodiments, the memory and processor may be integrated into a common device (e.g., a microprocessor may include integrated memory). Additionally or alternatively, the processing circuitry may comprise hardware, such as an application specific integrated circuit ("ASIC"). Other non-limiting examples of the processing circuitry include an Integrated Circuit ("IC") chip, a Central Processing Unit ("CPU"), a General Processing Unit ("GPU"), a microprocessor, a Field Programmable Gate Array ("FPGA"), a collection of logic gates or transistors, resistors, capacitors, inductors, diodes, or the like. Some or all of the processing circuitry may be provided on the circuit substrate 106 of the pluggable network interface device 100. The circuit substrate 106 may correspond to a PCB or a collection of PCBs. It should be appreciated that any appropriate type of electrical component or collection of electrical components may be suitable for inclusion in the processing circuitry.

The housing 104 may be configured as a split-shell housing having a first shell portion 104A and a second shell portion 104B. The first shell portion 104A may be referred to herein as a top shell, or top backshell, and the second shell portion 104B may be referred to herein as a bottom shell, or bottom backshell. The first shell portion 104A may include a first cavity or space that runs along the length, L, of the pluggable network interface device 100. The second shell portion 104B may include a second cavity or space that runs along the length, L, of the pluggable network interface device 100. As provided above, the length, L, of the pluggable network interface device 100 may be measured from a first end 130A to an opposite second end 130B of the pluggable network interface device 100. Together, the first cavity and the second cavity form a receiving cavity 110 of the pluggable network interface device 100. The receiving cavity 110 may be sized to receive at least a portion of the circuit substrate 106 including at least one heat-generating circuit package 108. For instance, the circuit substrate 106 may be placed inside the first cavity and/or the second cavity and the first shell portion 104A may be attached (e.g., clipped, fastened, pinned, etc., and/or combinations thereof) to the second shell portion 104B forming the pluggable network interface device 100. When attached to one another, a height of the housing 104 and/or the pluggable network interface device 100 may be measured from a surface of the first shell portion 104A that is disposed adjacent the first height side 140A to a surface of the second shell portion 104B that is disposed adjacent the second height side 140B. The outer surface of the housing 104 may provide an outer shell that defines the exterior of the housing 104. In some embodiments, the outer shell separates the receiving cavity 110 from the exterior 122 of the housing 104 (e.g., separating an interior of the pluggable network interface device 100 from the environment that is exterior to the housing 104).

The pluggable network interface device 100 includes a heatsink 112 that is arranged in direct contact with the heat-generating circuit package 108. The heatsink 112 includes a first surface 116A on one side of the heatsink 112 and a second surface 116B disposed on an opposite side of the heatsink 112 (e.g., opposite the first surface 116A). The first surface 116A is offset a thickness from the second surface 116B. The first surface 116A may be arranged at an exterior 122 of the housing 104 and the second surface 116B may be arranged in direct contact with the outer surface 109 of the heat-generating circuit package 108 of the circuit substrate 106. For instance, the first surface 116A may be arranged in an aperture 120 of the housing 104 that extends through the first shell portion 104A from the exterior 122 of the housing 104 into the receiving cavity 110 of the pluggable network interface device 100. The aperture 120 may correspond to an opening where the first surface 116A of the heatsink 112 is disposed adjacent, and exposed to, the exterior 122. In this arrangement a heat transfer path (e.g., via conduction, etc.) is provided from the outer surface 109 of the heat-generating circuit package 108 to the second surface 116B (e.g., via direct contact) and through the thickness of the heatsink 112 to the second surface 116B that is disposed outside of the receiving cavity 110 of the pluggable network interface device 100. The heat transfer path may provide a "zero gap" conduction path that does not include TIM between the heat-generating circuit package 108 and the heatsink 112. As can be appreciated, since there is no TIM between the heat-generating circuit package 108 and the heatsink 112, the $R_{th}$ equals the $R_{contact}$ only and provides a low thermal resistance and a low gradient for the pluggable network interface device 100 described herein.

The heatsink 112 may be arranged including a flange, ledge, or other outer peripheral protrusion extending from a periphery thereof. The outer peripheral protrusion may provide a surface that retains the second surface 116B of the heatsink 112 inside the receiving cavity 110. In some embodiments, a thermal putty, gasket, O-ring, room temperature vulcanizing ("RTV") sealant, etc., and/or some other type of compliant seal may be arranged between the outer peripheral protrusion and/or a periphery of the heatsink 112 and the first shell portion 104A. The compliant seal may provide a watertight, airtight, or hermetic seal between the receiving cavity 110 and the exterior 122 around a periphery (e.g., outermost periphery, etc.) of the heatsink 112 and the aperture 120. Additionally or alternatively, the compliant seal may provide a cushioned interface between the heatsink 112 and the first shell portion 104A. This cushioned interface may accommodate dimensional changes (e.g., due to thermal expansion and contraction, etc.) of the height of components of the pluggable network interface device 100 during operation, etc. In some embodiments, the cushioned interface may accommodate differences in height dimensions of components of the pluggable network interface device 100 due to tolerancing, machining, forming, and/or assembly processes.

The heatsink 112 may be held, or maintained, against the heat-generating circuit package 108 of the circuit substrate 106 by at least one spring 118. More specifically, the second surface 116B of the heatsink 112 may be held in direct contact with the outer surface 109 of the heat-generating circuit package 108 by a clamp force provided by the spring 118. The spring 118 may be configured as an extension spring, compression spring, helical spring, leaf spring, spring clip, torsion spring, spiral spring, die spring, disk spring, wave spring, flat spring, combinations thereof, and/or the like. In any event, the spring 118 may maintain a clamp force and the direct contact between the second surface 116B of the heatsink 112 and the outer surface 109 of the at least one heat-generating circuit package 108.

In some embodiments, the heatsink 112 may be mounted in direct contact with the heat-generating circuit package 108 (e.g., via the spring 118, etc.) prior to inserting the circuit substrate 106, heat-generating circuit package 108, and the heatsink 112 into the receiving cavity 110 of the pluggable network interface device 100. Stated another way, the circuit substrate 106, the heat-generating circuit package 108, and the heatsink 112 may be connected together and held in a clamped state by the spring 118 as a subassembly before the subassembly is attached to the housing 104 of the pluggable network interface device 100. By way of example, the subassembly may be positioned inside a portion of the receiving cavity 110 in the second shell portion 104B and then the first shell portion 104A may be attached to the second shell portion 104B. Before the first shell portion 104A is attached to the second shell portion 104B, the first surface 116A of the heatsink 112 may be aligned with the aperture 120 in the first shell portion 104A. Then, as the first shell portion 104A and the second shell portion 104B are moved into contact with one another, the first surface 116A may be caused to enter into the aperture 120 exposing the first surface 116A to the exterior 122.

Figure 2:
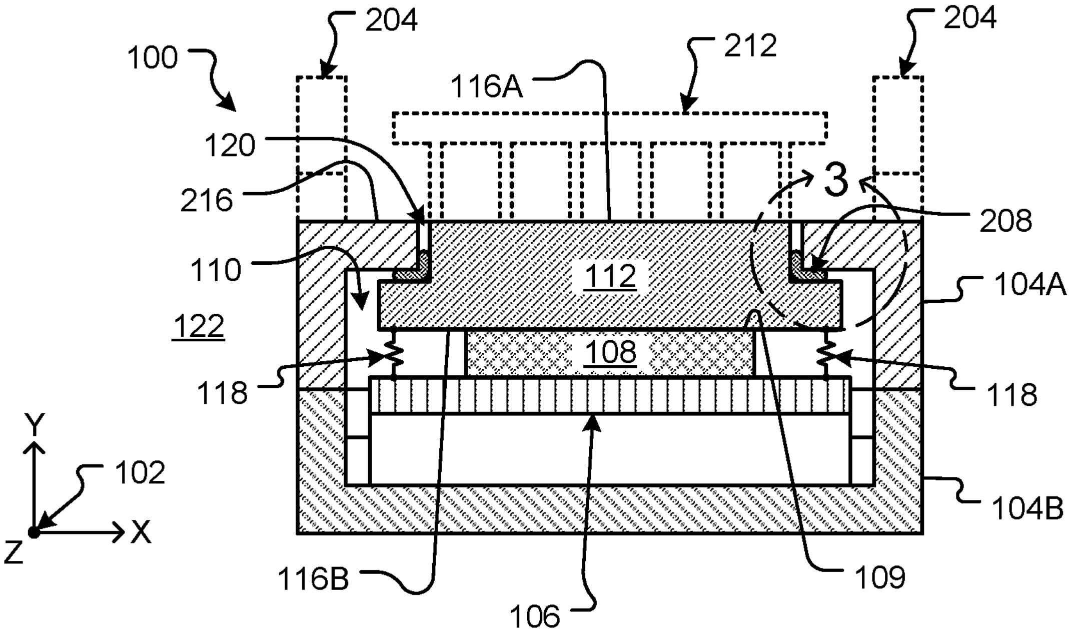
FIG. 2 shows a section view taken through line "2-2" of FIG. 1 in accordance with embodiments of the present disclosure.

FIG. 2 shows a section view taken through line "2-2" of FIG. 1 in accordance with embodiments of the present disclosure. As illustrated in FIG. 2, the pluggable network interface device 100 may include one or more extended width walls 204 of the first shell portion 104A and/or an extended heatsink portion 212 of the heatsink 112. Stated another way, the direct contact heat transfer arrangement of the pluggable network interface device 100 is not particularly limited to the arrangement of the pluggable network interface device 100. For example, the direct contact heat transfer arrangement may be employed in OSFP integrated heatsink ("IHS") modules, OSFP riding heatsink ("RHS") modules, and/or the like. In some embodiments, the first surface 116A may be flush with, or in the same plane as, the outermost height surface 216 of the first shell portion 104A. In one embodiment, the first surface 116A may be under flush with, or below the plane of, the outermost height surface 216 of the first shell portion 104A.

The second surface 116B of the heatsink 112 is shown in direct contact with the outer surface 109 of the heat-generating circuit package 108. The term "direct contact"

may be used herein to refer to a surface-to-surface contact between the heatsink 112 and the heat-generating circuit package 108 without disposing a TIM, paste, or some other interstitial element between the second surface 116B and the outer surface 109 of the heat-generating circuit package 108.

Figure 3:
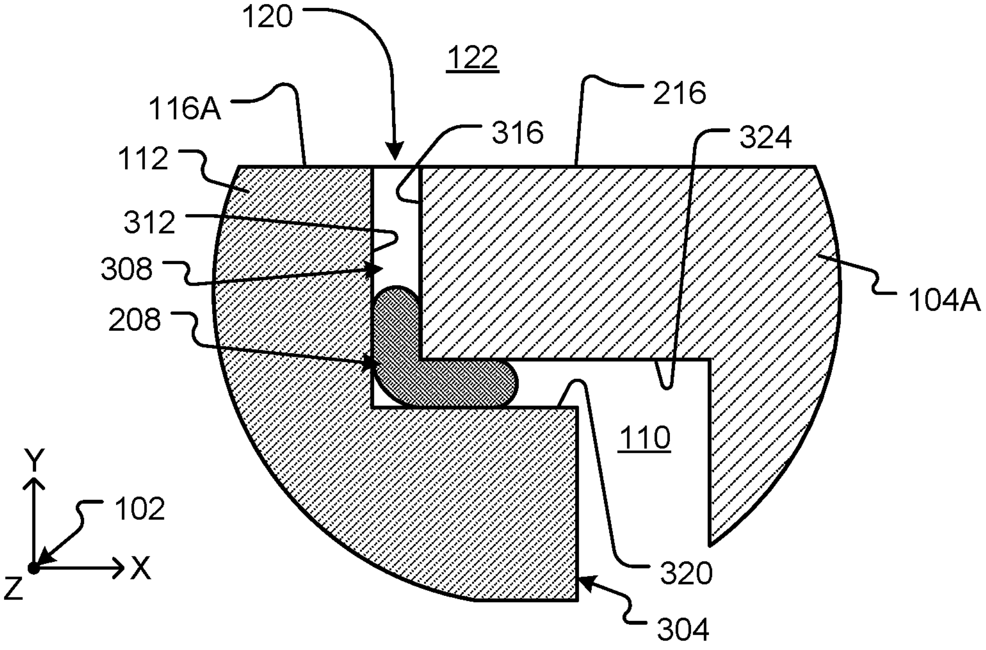
FIG. 3 shows a detail partial section view taken from circle "3" of FIG. 2 in accordance with embodiments of the present disclosure.

A compliant seal 208 is shown disposed between the heatsink 112 and the first shell portion 104A. The compliant seal 208 may be compressed between the heatsink 112 and the housing 104. This compression may form an airtight seal between the exterior of the housing and the receiving cavity. In some embodiments, the compliant seal 208 may surround a periphery of the aperture 120 and the portion of the heatsink 112 that is disposed inside the aperture 120. As shown in FIG. 3, the compliant seal 208 may be arranged in a peripheral gap 308 that is disposed between the vertical heatsink surface 312 of the portion of the heatsink 112 disposed in the aperture 120 and the internal vertical surface 316 of the aperture 120. Additionally or alternatively, the compliant seal 208 may be arranged around the periphery of the aperture 120 between the horizontal surface 320 of the flange 304 of the heatsink 112 and the internal horizontal surface 324 of the first shell portion 104A of the housing 104. In any event, the compliant seal 208 may form an airtight or watertight seal between the receiving cavity 110 and the exterior 122 of the housing 104.

The spring 118 in FIG. 2 is schematically shown as providing a clamp force between the heatsink 112 and the heat-generating circuit package 108. The at least one spring 118 may be mounted in any arrangement inside the receiving cavity 110 of the pluggable network interface device 100 that is capable of maintaining the second surface 116B of the heatsink 112 in direct contact with the outer surface 109 of the heat-generating circuit package 108.

Figure 4:
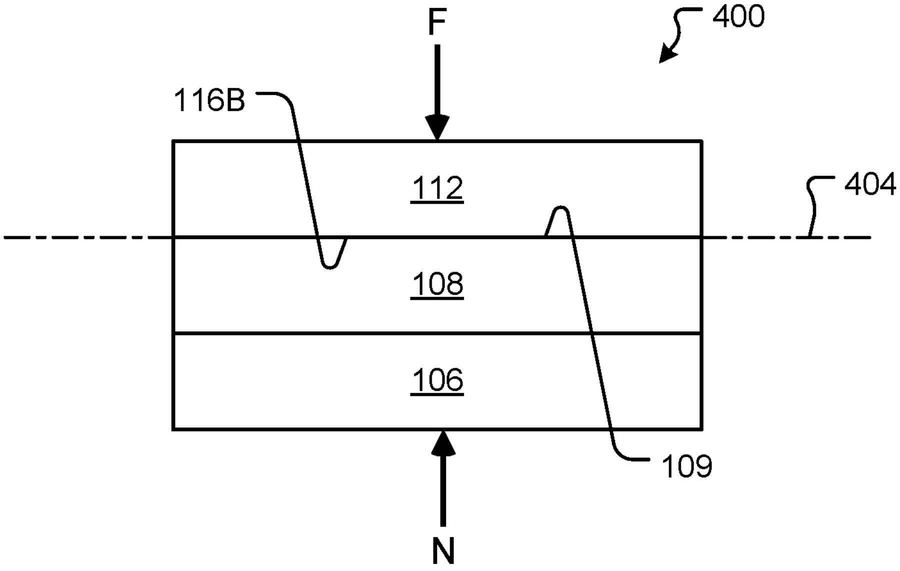
FIG. 4 is a schematic force block diagram of a direct contact heatsink arrangement in accordance with embodiments of the present disclosure.

FIG. 4 shows an example of a schematic force block diagram 400 of the direct contact heatsink 112 arrangement of the pluggable network interface device 100 as described herein. As illustrated in FIG. 4, the heatsink 112 of the pluggable network interface device 100 is maintained in direct contact with the heat-generating circuit package 108 via a clamping force represented by the clamp force, F, and the opposing normal force, N. More specifically, the second surface 116B of the heatsink 112 is maintained in direct contact with the outer surface 109 of the heat-generating circuit package 108 along the direct contact plane 404. In this arrangement, no other component is disposed between the second surface 116B and the heat-generating circuit package 108. Among other things, this arrangement provides a zero gap interface and enhanced conduction heat transfer path between the heatsink 112 and the heat-generating circuit package 108 for the pluggable network interface device 100.

In the following description, certain features, elements, and structures having the same configuration and/or the same function as those of the pluggable network interface device 100 described above may be designated by the same reference numeral and, as such, a detailed description of those features, elements, and/or structures is omitted for the sake of brevity.

Figure 5A:
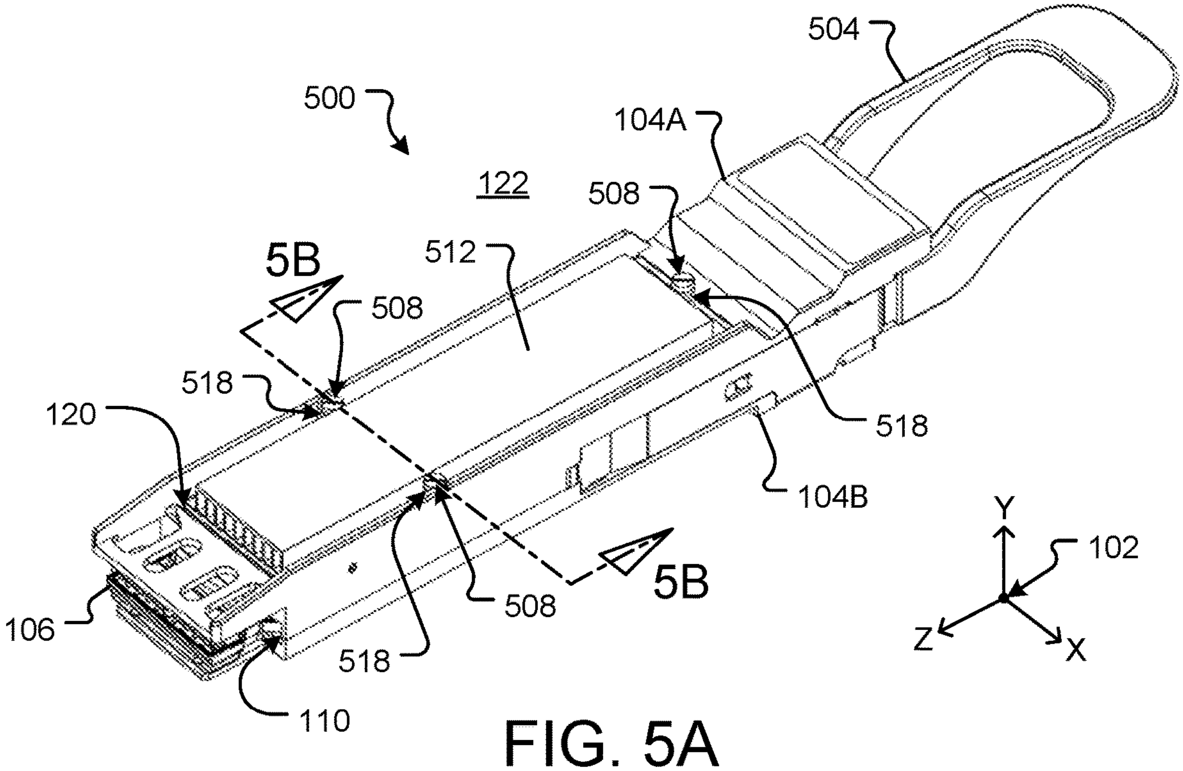
FIG. 5A shows a perspective view of a pluggable network interface device in accordance with embodiments of the present disclosure.
Figure 5B:
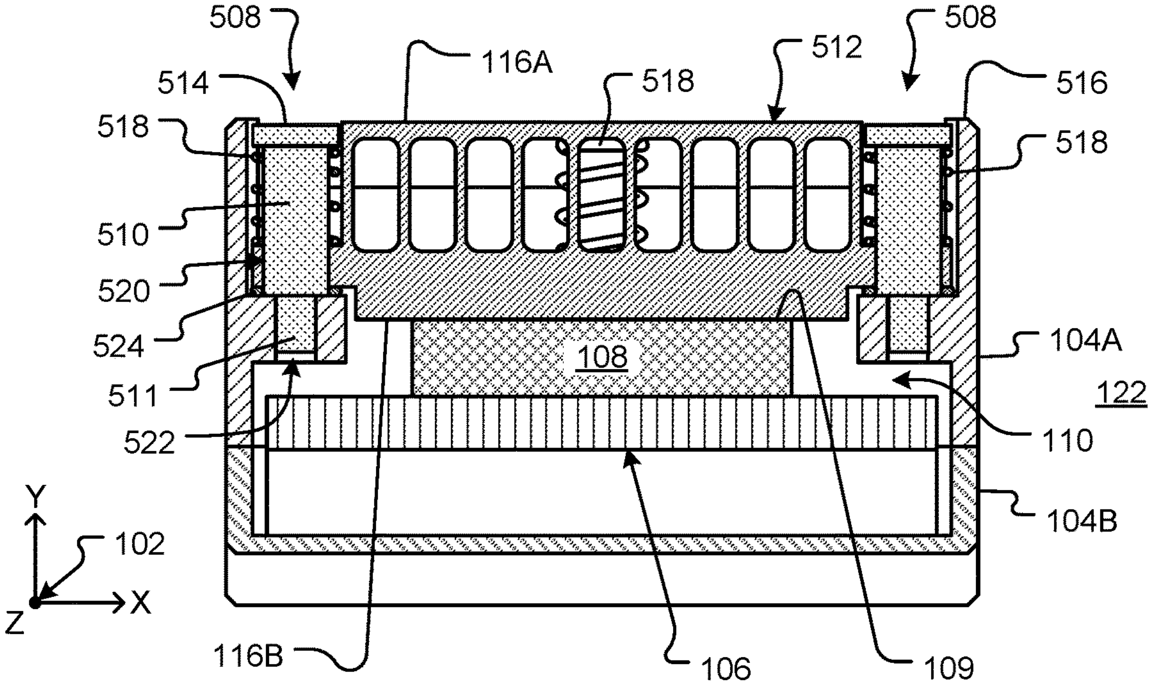
FIG. 5B shows a section view taken through line "5B-5B" of FIG. 5A in accordance with embodiments of the present disclosure.

Referring now to FIGS. 5A and 5B, a pluggable network interface device 500 is shown in accordance with embodiments of the present disclosure. The pluggable network interface device 500 may correspond to the pluggable network interface device 100 described in conjunction with FIGS. 1A-4. For instance, the pluggable network interface device 500 includes a heatsink 512 (e.g., similar, if not identical, to the heatsink 112) having a second surface 116B that is arranged in direct contact with the outer surface 109 of the heat-generating circuit package 108 of the circuit substrate 106. The pluggable network interface device 500 may include a first clamping arrangement between the heatsink 512 and the heat-generating circuit package 108.

A perspective view of the pluggable network interface device 500 is shown in FIG. 5A. In some embodiments, the pluggable network interface device 500 may include a pull tab 504. The pull tab 504 may include a handle portion and/or aperture that can be grasped when handling, plugging, or unplugging the pluggable network interface device 500 with a receiving connection. The pluggable network interface device 500 may include plurality of fasteners 508 and springs 518 that provide the clamp force between the heatsink 512 and the heat-generating circuit package 108.

As illustrated in the section view of FIG. 5B (taken through line "5B-5B" of FIG. 5A), the fastener 508 may comprise a body 510 extending from a first end of the fastener 508 to a second end of the fastener 508. The body 510 may include a threaded portion 511 adjacent the second end of the fastener 508 and a cap portion 514 adjacent the first end of the fastener 508. In some embodiments, the fastener 508 may correspond to a shoulder screw where the body 510 is configured as a cylindrical unthreaded portion. The fastener 508 may be attached to the housing 104 via the threaded portion 511 threadedly engaging with a threaded hole 522 disposed in the first shell portion 104A of the housing 104. The heatsink 512 may include clearance holes 520 positioned at the locations of the fasteners 508. The clearance hole may allow the heatsink 512 to translate (e.g., in the Y-axis direction) but remain constrained in the X-axis and Z-axis directions. A spring 518 may be arranged between the cap portion 514 of each fastener 508 and the heatsink 512. The spring 518 may correspond to the spring 118 as described above. In some embodiments, each spring 518 may correspond to a compression spring that surrounds the body 510 of an associated fastener 508. The spring 518 may provide a spring force between the cap portion 514 of a fastener 508 and the heatsink 512. This spring force may bias, maintain, or clamp the heatsink 512 against the heat-generating circuit package 108 (e.g., in the negative Y-axis direction) such that the second surface 116B of the heatsink 512 is arranged in direct contact with the outer surface 109 of the heat-generating circuit package 108 of the circuit substrate 106.

The pluggable network interface device 500 may include a compliant seal 524 that surrounds the periphery of the aperture 120. The compliant seal 524 may correspond to the compliant seal 208 described above. As illustrated in FIG. 5B, the compliant seal 524 is disposed between the heatsink 512 and the first shell portion 104A providing an airtight seal between the receiving cavity 110 and the exterior 122 of the housing 104.

The first surface 116A of the heatsink 512 may be arranged flush, or under flush, with the outermost height surface 516 of the pluggable network interface device 500. In some embodiments, the first surface 116A may be prevented from extending above the outermost height surface 516 of the pluggable network interface device 500 (e.g., in the Y-axis direction). Among other things, this arrangement may ensure that the dimensions of the pluggable network interface device 500 comport with OSFP standards.

Figure 6A:
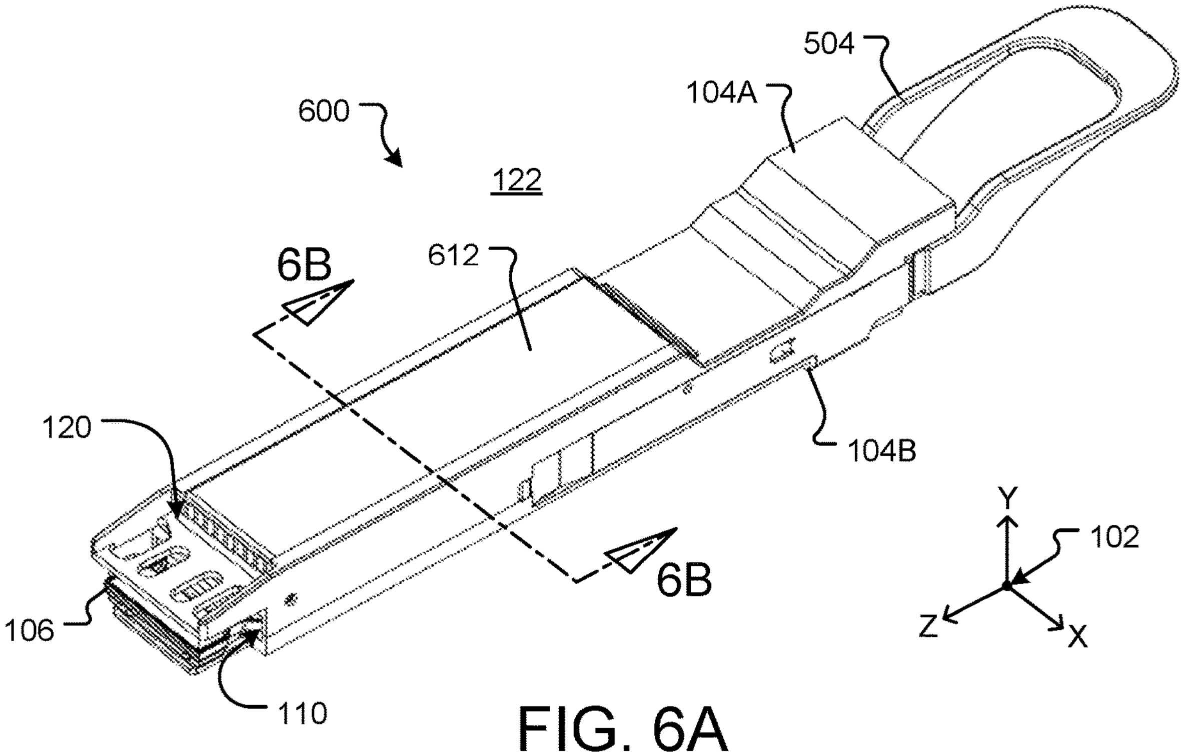
FIG. 6A shows a perspective view of a pluggable network interface device in accordance with embodiments of the present disclosure.
Figure 6B:
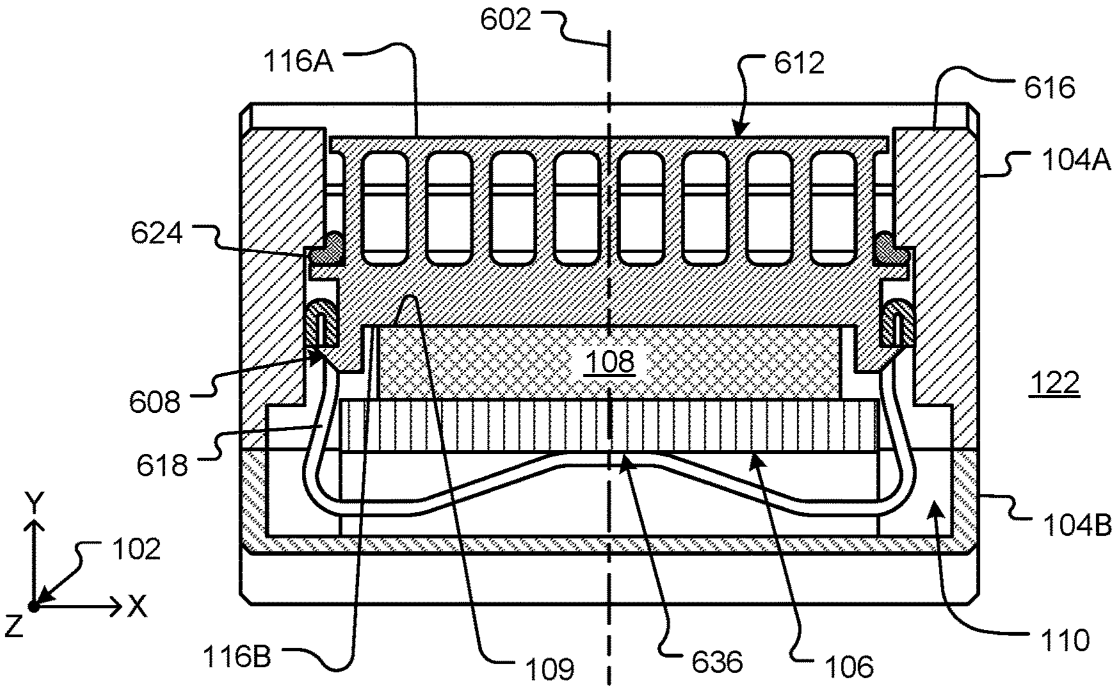
FIG. 6B shows a section view taken through line "6B-6B" of FIG. 6A in accordance with embodiments of the present disclosure.
Figure 6C:
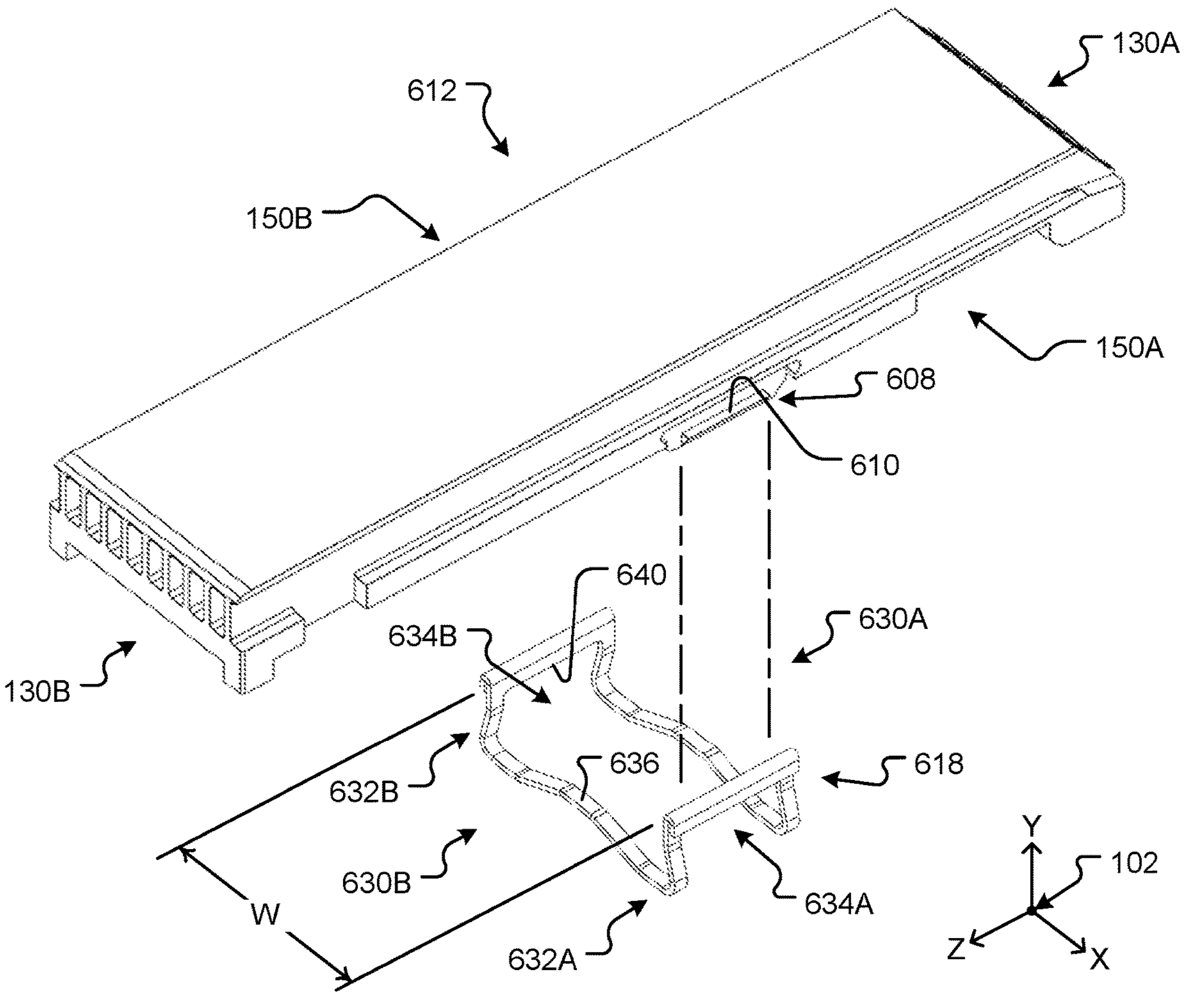
FIG. 6C shows an exploded perspective view of a heatsink and spring arrangement of the pluggable network interface device shown in FIG. 6A in accordance with embodiments of the present disclosure.

FIGS. 6A-6C show various views of a pluggable network interface device 600 and components thereof in accordance with embodiments of the present disclosure. The pluggable network interface device 600 may correspond to the pluggable network interface device 100 described in conjunction with FIGS. 1A-4. For instance, the pluggable network interface device 600 includes a heatsink 612 (e.g., similar, if not identical, to the heatsink 112) having a second surface 116B that is arranged in direct contact with the outer surface 109 of the heat-generating circuit package 108 of the circuit substrate 106. The pluggable network interface device 600 may include a second clamping arrangement between the heatsink 612 and the heat-generating circuit package 108.

A perspective view of the pluggable network interface device 600 is shown in FIG. 6A. In some embodiments, the pluggable network interface device 600 may include a pull tab 504. The pluggable network interface device 600 may include a clip type of spring 618 (e.g., spring clip) that provides the clamp force between the heatsink 612 and the heat-generating circuit package 108.

As illustrated in the section view of FIG. 6B (taken through line "6B-6B" of FIG. 6A), the spring 618 may be configured as a bent, or shaped, clip that engages with one or more tabs 608 of the heatsink 612. The spring 618 may correspond to the spring 118 as described above. In addition to contacting the tabs 608 of the heatsink 612, the spring 618 may simultaneously contact the circuit substrate 106. For instance, the spring 618 may wrap around a portion of the circuit substrate 106 and contact a center portion of the circuit substrate 106 (e.g., located along the centerline 602 of the pluggable network interface device 600). In some embodiments, the pluggable network interface device 600 and/or the components thereof may be symmetrical about the centerline 602.

FIG. 6C shows an exploded perspective view of the heatsink 612 and the spring 618 shown in FIG. 6B. The spring 618 may include a first leg 632A including a first slot 634A and a second leg 632B including a second slot 634B. The second leg 632B may be disposed offset a width distance, W, from the first leg 632A. The spring 618 may include a center portion 636 (e.g., center spring contact portion) that is disposed between, and joins, the first leg 632A and the second leg 632B. In some embodiments, the spring 618 may include a spanning surface 640 that extends along the Z-axis direction on the first leg 632A and second leg 632B. The spanning surface 640 may correspond to a clip surface that engages with the ledge surface 610 of the tab 608. For instance, the spanning surface 640 of the first leg 632A may engage with the ledge surface 610 of the tab 608 disposed on the first width side 150A of the pluggable network interface device 600. The spanning surface 640 of the second leg 632B may engage with the ledge surface 610 of the tab 608 disposed on the second width side 150B of the pluggable network interface device 600. In any event, the spring 618 maintains the second surface 116B of the heatsink 612 in direct contact with the outer surface 109 of the at least one heat-generating circuit package 108.

As shown in FIG. 6B, the spring 618 may provide the clamp force that biases, maintains, or clamps the heatsink 612 against the heat-generating circuit package 108 (e.g., in the negative Y-axis direction) such that the second surface 116B of the heatsink 612 is arranged in direct contact with the outer surface 109 of the heat-generating circuit package 108 of the circuit substrate 106. The pluggable network interface device 600 may include a compliant seal 624 that surrounds the periphery of the aperture 120. The compliant seal 624 may correspond to the compliant seal 208 described above. As illustrated in FIG. 6B, the compliant seal 624 is disposed between the heatsink 612 and the first shell portion 104A providing an airtight seal between the receiving cavity 110 and the exterior 122 of the housing 104.

The first surface 116A of the heatsink 612 may be arranged flush, or under flush, with the outermost height surface 616 of the pluggable network interface device 600. In some embodiments, the first surface 116A may be prevented from extending above the outermost height surface 616 of the pluggable network interface device 600 (e.g., in the Y-axis direction). Among other things, this arrangement may ensure that the dimensions of the pluggable network interface device 600 comport with OSFP standards (e.g., IHS OSFP module standards, etc.).

Figure 7A:
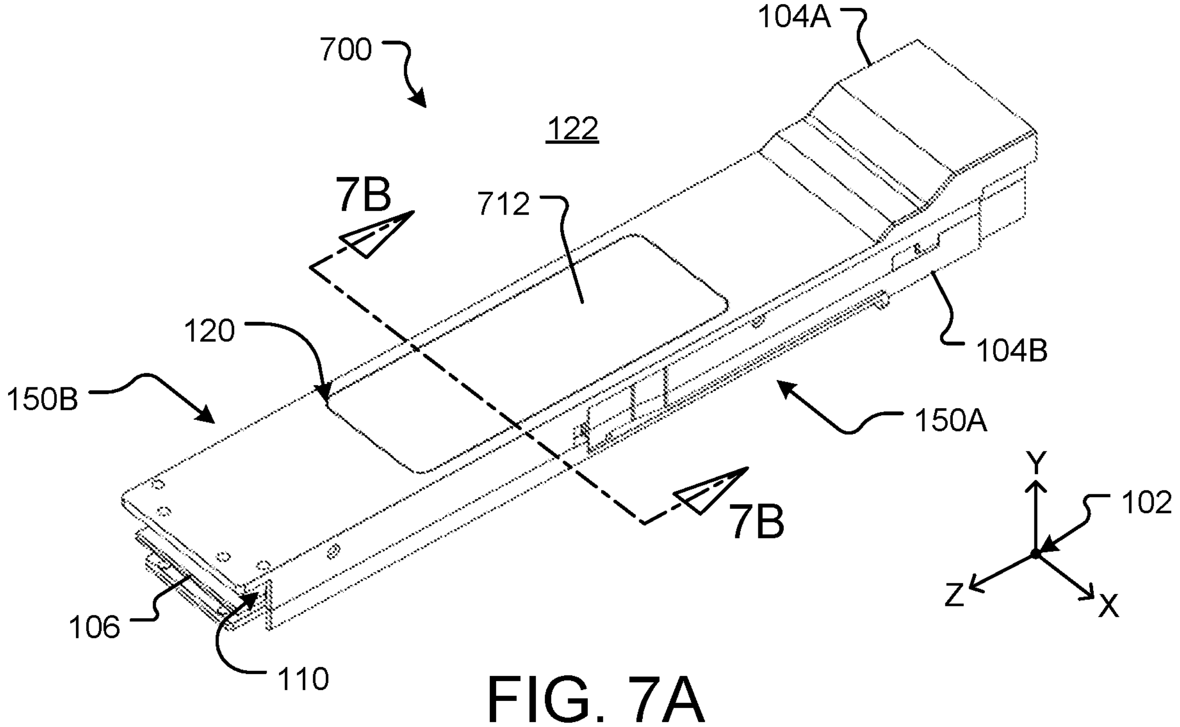
FIG. 7A shows a perspective view of a pluggable network interface device in accordance with embodiments of the present disclosure.
Figure 7B:
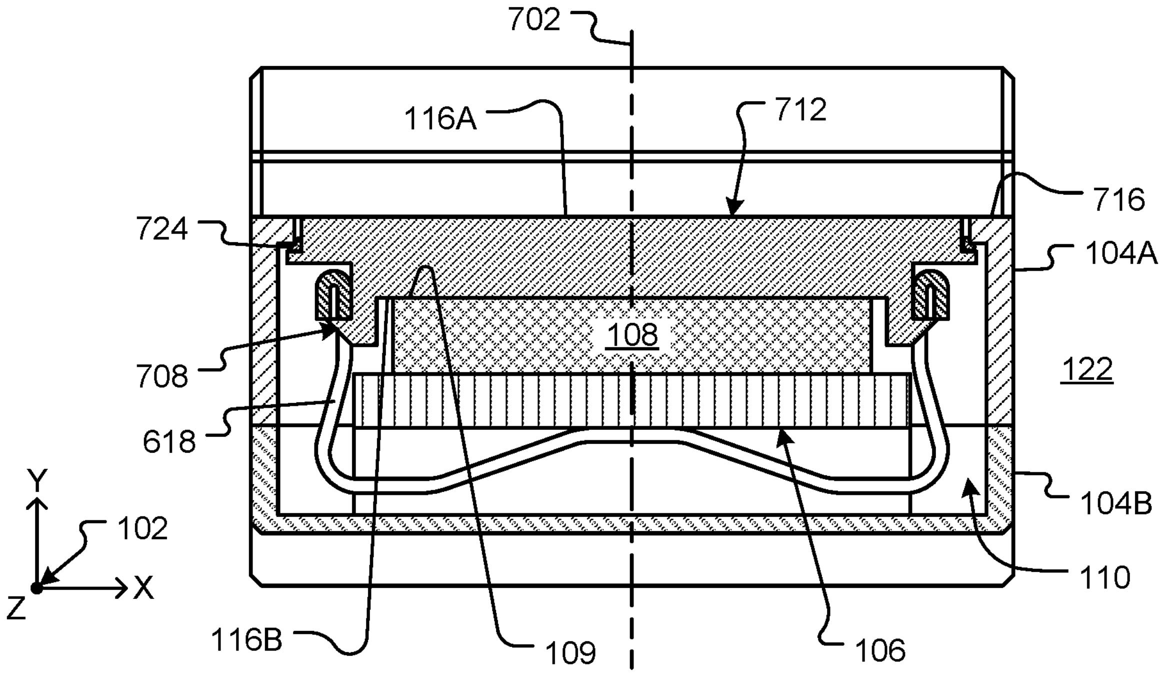
FIG. 7B shows a section view taken through line "7B-7B" of FIG. 7A in accordance with embodiments of the present disclosure.

FIGS. 7A and 7B show a pluggable network interface device 700 and components thereof in accordance with embodiments of the present disclosure. The pluggable network interface device 700 may correspond to the pluggable network interface device 100 described in conjunction with FIGS. 1A-4. For instance, the pluggable network interface device 700 includes a heatsink 712 (e.g., similar, if not identical, to the heatsink 112) having a second surface 116B that is arranged in direct contact with the outer surface 109 of the heat-generating circuit package 108 of the circuit substrate 106. The pluggable network interface device 700 may include the same clamping arrangement as described above in conjunction with FIGS. 6A-6C.

A perspective view of the pluggable network interface device 700 is shown in FIG. 7A. The pluggable network interface device 700 may correspond to an RHS OSFP module, while the pluggable network interface device 600 may correspond to an IHS OSFP module. In any event, the pluggable network interface device 700 shown in FIGS. 7A and 7B may include the same clip type of spring 618 (e.g., spring clip) that provides the clamp force between the heatsink 712 and the heat-generating circuit package 108 of the circuit substrate 106.

As shown in the section view of FIG. 7B (taken through line "7B-7B" of FIG. 7A), the spring 618 may be configured as a bent, or shaped, clip that engages with one or more tabs 708 of the heatsink 712. The spring 618 may correspond to the spring 118 as described above. In addition to contacting the tabs 708 of the heatsink 712, the spring 718 may simultaneously contact the circuit substrate 106. For instance, the spring 718 may wrap around a portion of the circuit substrate 106 and contact a center portion of the circuit substrate 106 (e.g., located along the centerline 702 of the pluggable network interface device 800). In some embodiments, the pluggable network interface device 700 and/or the components thereof may be symmetrical about the centerline 702.

The spanning surface 640 of the spring 618 (e.g., shown in FIG. 6C) may correspond to a clip surface that engages with a ledge surface of the tab 708. The ledge surface of the tab 708 of the heatsink 712 may be the same as the ledge surface 610 of the tab 608 shown in FIG. 6C. Similar to the engagement of the spring 618 described above, the spanning surface 640 of the first leg 632A of the spring 618 may engage with the ledge surface of the tab 708 disposed on the first width side 150A of the pluggable network interface device 700 and the spanning surface 640 of the second leg 632B may engage with the ledge surface of the tab 708 disposed on the second width side 150B of the pluggable network interface device 700. The spring 618 maintains the second surface 116B of the heatsink 712 in direct contact with the outer surface 109 of the at least one heat-generating circuit package 108 of the pluggable network interface device 700.

As shown in FIG. 7B, the spring 618 may provide the clamp force that biases, maintains, or clamps the heatsink 712 against the heat-generating circuit package 108 (e.g., in the negative Y-axis direction) such that the second surface 116B of the heatsink 712 is arranged in direct contact with the outer surface 109 of the heat-generating circuit package 108 of the circuit substrate 106. The pluggable network interface device 700 may include a compliant seal 724 that surrounds the periphery of the aperture 120. The compliant seal 724 may correspond to the compliant seal 208, or the compliant seal 624, described above. As illustrated in FIG. 7B, the compliant seal 624 is disposed between the heatsink 712 and the first shell portion 104A providing an airtight seal between the receiving cavity 110 and the exterior 122 of the housing 104.

The first surface 116A of the heatsink 712 may be arranged flush, or under flush, with the outermost height surface 716 of the pluggable network interface device 700. In some embodiments, the first surface 116A may be prevented from extending above the outermost height surface 716 of the pluggable network interface device 700 (e.g., in the Y-axis direction). Among other things, this arrangement may ensure that the dimensions of the pluggable network interface device 700 comport with OSFP standards (e.g., RHS OSFP module standards, etc.).

FIGS. 8A-8D show various views of a pluggable network interface device 800 and components thereof in accordance with embodiments of the present disclosure. The pluggable network interface device 800 may correspond to the pluggable network interface device 100 described in conjunction with FIGS. 1A-4. For instance, the pluggable network interface device 800 includes a heatsink 812 (e.g., similar, if not identical, to the heatsink 112) having a second surface 116B that is arranged in direct contact with the outer surface 109 of the heat-generating circuit package 108 of the circuit substrate 106. The pluggable network interface device 800 may include a third clamping arrangement between the heatsink 812 and the heat-generating circuit package 108.

Figure 8A:
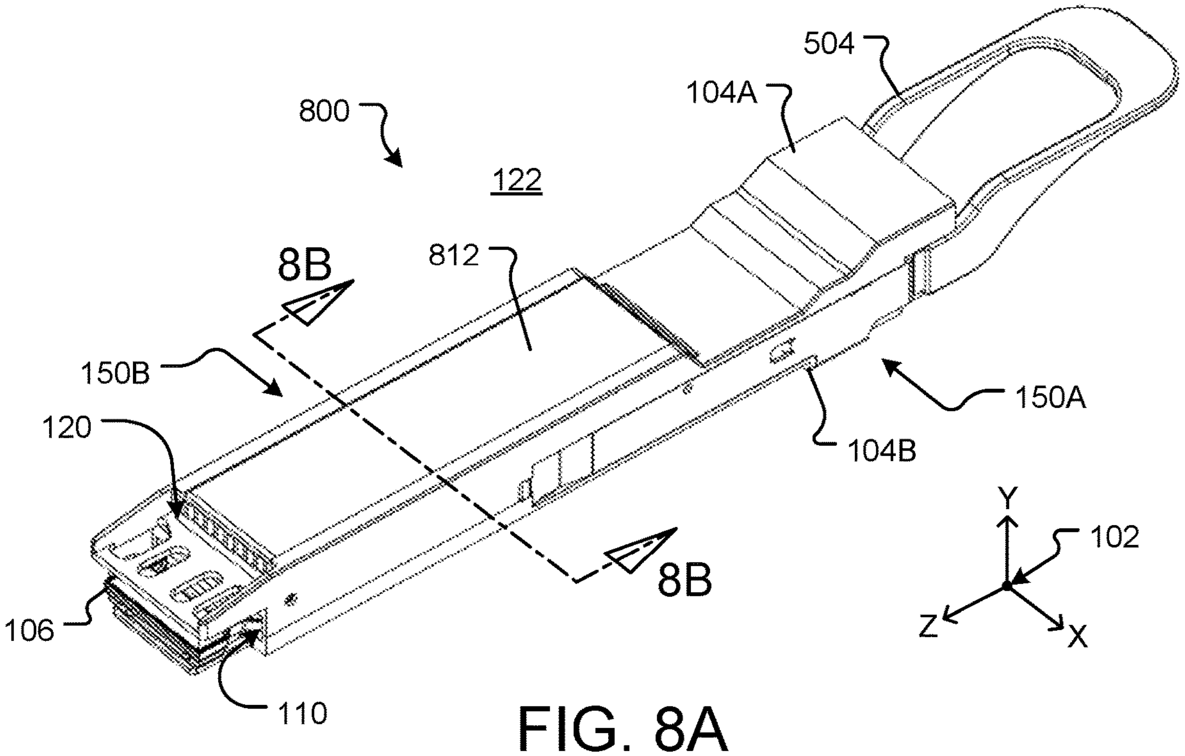
FIG. 8A shows a perspective view of a pluggable network interface device in accordance with embodiments of the present disclosure.

A perspective view of the pluggable network interface device 800 is shown in FIG. 8A. In some embodiments, the pluggable network interface device 800 may include a pull tab 504. The pluggable network interface device 800 may include two clip types of springs 818 (e.g., spring clips) that provide the clamp force between the heatsink 812 and the heat-generating circuit package 108.

Figure 8B:
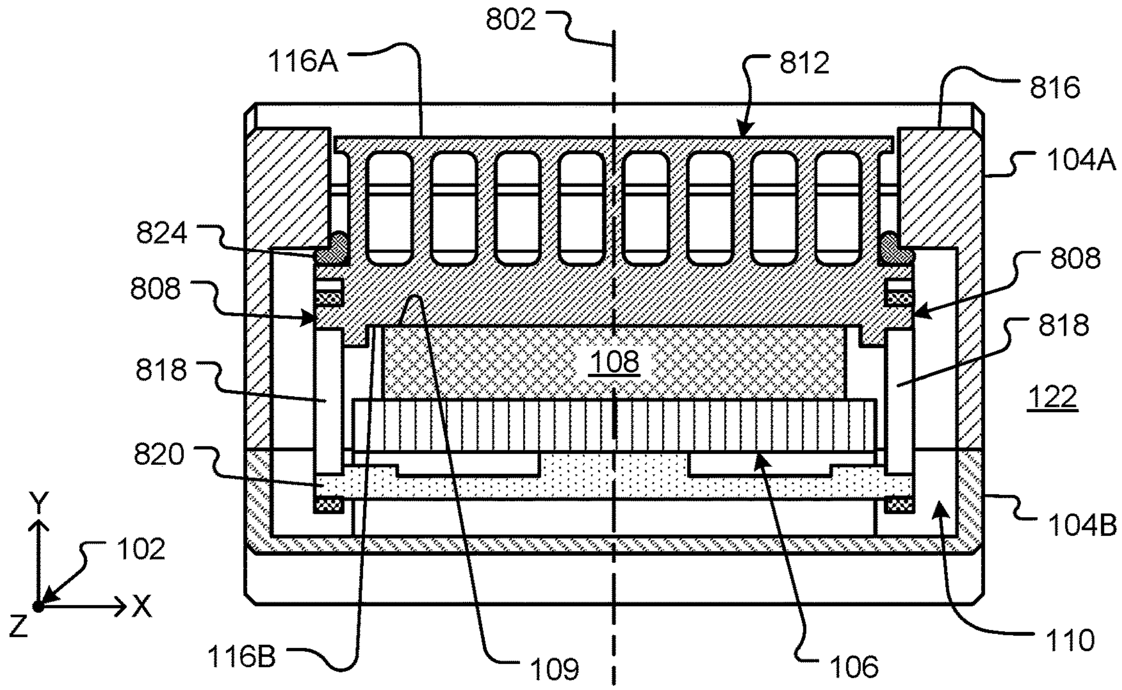
FIG. 8B shows a section view taken through line "8B-8B" of FIG. 8A in accordance with embodiments of the present disclosure.

As illustrated in the section view of FIG. 8B (taken through line "8B-8B" of FIG. 8A), the springs 818 may be configured as shaped clips that engage with the spring support posts 808 of the heatsink 812. The spring support post 808 may be configured as a post protrusion that extends from the heatsink 812 in the X-axis direction. For instance, a spring 818 on the first width side 150A may be attached to a spring support post 808 extending from the heatsink 812 in a direction from the center of the pluggable network interface device 800 toward the first width side 150A. A spring 818 on the second width side 150B may be attached to a spring support post 808 extending from the heatsink 812 in a direction from the center of the pluggable network interface device 800 toward the second width side 150B. The spring 818 may correspond to the spring 118 as described above. In addition to contacting the spring support posts 808 of the heatsink 812, the springs 818 may simultaneously contact a portion of a clamp plate 820 that is arranged under the circuit substrate 106. Stated another way, the circuit substrate 106 and the heat-generating circuit package 108 may be sandwiched between the heatsink 812 and the clamp plate 820, while the spring 818 provide the clamp force holding the second surface 116B of the heatsink 812 against the outer surface 109 of the heat-generating circuit package 108. In some embodiments, the pluggable network interface device 800 and/or the components thereof may be symmetrical about the centerline 802.

Figure 8C:
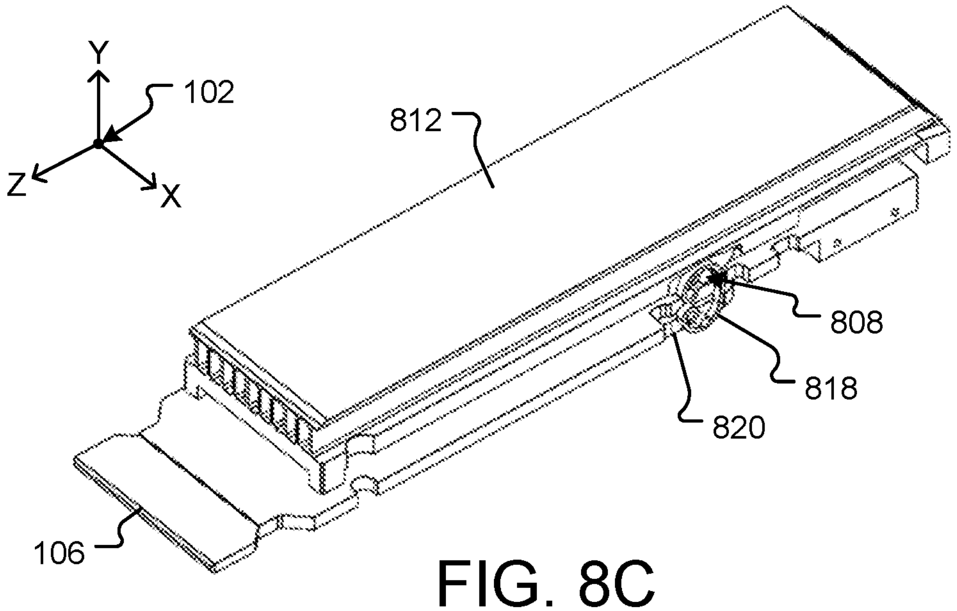
FIG. 8C shows a perspective view of a heatsink and spring arrangement of the pluggable network interface device shown in FIG. 8A in accordance with embodiments of the present disclosure.

FIG. 8C shows a perspective view of the heatsink 812 maintained in a clamped state against the heat-generating circuit package 108 by the spring 818 and the clamp plate 820 without the other components of the pluggable network interface device 800 shown, for clarity. This arrangement may be referred to herein as the direct contact thermal transfer subassembly. Although only one side of the subassembly is shown in FIG. 8C, it should be appreciated that the opposing side (e.g., the second width side 150B) may be symmetrical about the centerline 802 shown in FIG. 8B and, as such, may include the mirrored arrangement of components shown in FIG. 8C.

Figure 8D:
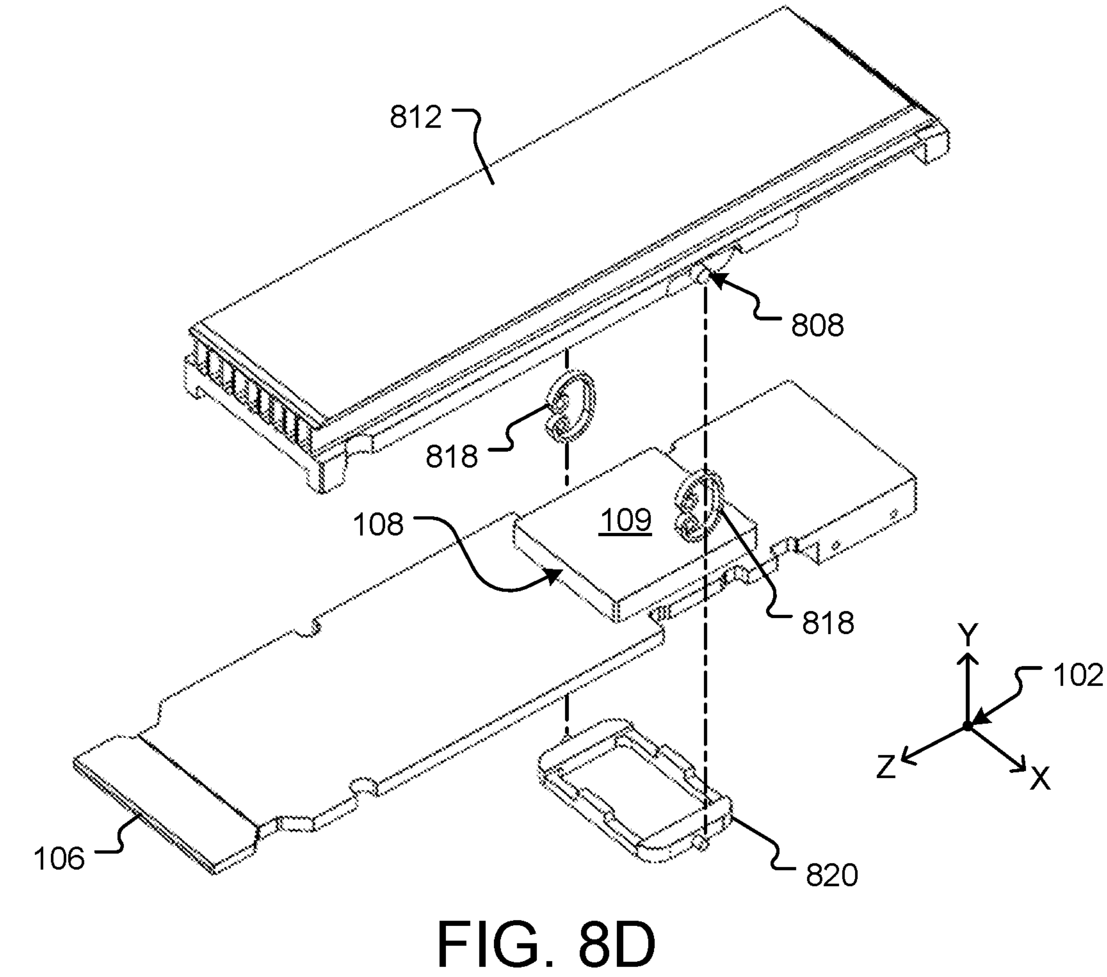
FIG. 8D shows an exploded perspective view of the heatsink and spring arrangement of the pluggable network interface device shown in FIG. 8C in accordance with embodiments of the present disclosure.

FIG. 8D shows an exploded perspective view of the components making up the subassembly shown in FIG. 8C. The springs 818 may be made from spring steel and/or some other metal capable of providing a clamping force between the heatsink 812 and the heat-generating circuit package 108 (e.g., via clamping the circuit substrate 106 and the heat-generating circuit package 108 between the heatsink 812 and the clamp plate 820). In some embodiments, the spring 818 may be hooked onto the spring support post 808 of the heatsink 812 at a first end of the spring 818 and then the spring 818 may be hooked onto the clamp plate 820 at a second end of the spring when the circuit substrate 106 and heat-generating circuit package 108 is disposed between the heatsink 812 and the clamp plate 820. The clamp plate 820 may be configured to apply the force from the springs 818 against the bottom surface of the circuit substrate 106 at a center of the pluggable network interface device 800 (e.g., along the centerline 802) under a location of the heat-generating circuit package 108. In any event, the springs 818 maintain the second surface 116B of the heatsink 812 in direct contact with the outer surface 109 of the at least one heat-generating circuit package 108 via a clamping force.

As shown in FIG. 8B, the springs 818 may provide the clamp force that biases, maintains, or clamps the heatsink 812 against the heat-generating circuit package 108 (e.g., in the negative Y-axis direction) such that the second surface 116B of the heatsink 812 is arranged in direct contact with the outer surface 109 of the heat-generating circuit package 108 of the circuit substrate 106. The pluggable network interface device 800 may include a compliant seal 824 that surrounds the periphery of the aperture 120. The compliant seal 824 may correspond to the compliant seal 208 described above. As illustrated in FIG. 8B, the compliant seal 824 is disposed between the heatsink 812 and the first shell portion 104A providing an airtight seal between the receiving cavity 110 and the exterior 122 of the housing 104.

The first surface 116A of the heatsink 812 may be arranged flush, or under flush, with the outermost height surface 816 of the pluggable network interface device 800. In some embodiments, the first surface 116A may be prevented from extending above the outermost height surface 616 of the pluggable network interface device 800 (e.g., in the Y-axis direction). Among other things, this arrangement may ensure that the dimensions of the pluggable network interface device 600 comport with OSFP standards (e.g., IHS OSFP module standards, etc.).

Figure 9A:
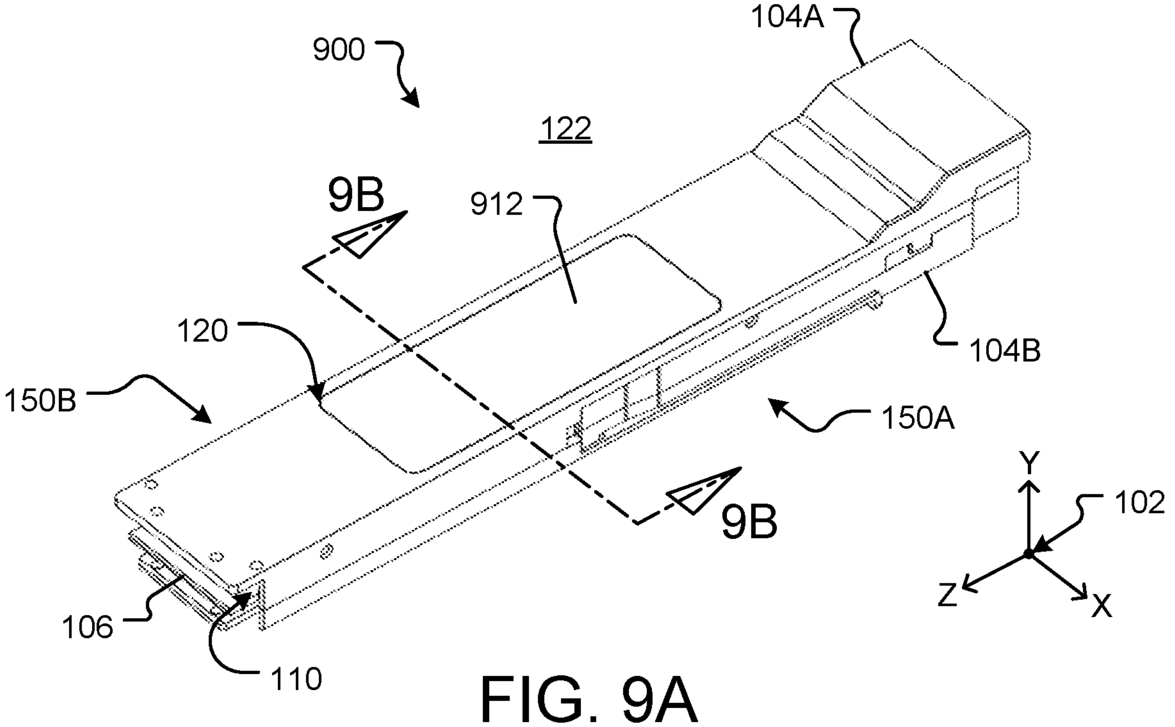
FIG. 9A shows a perspective view of a pluggable network interface device in accordance with embodiments of the present disclosure.
Figure 9B:
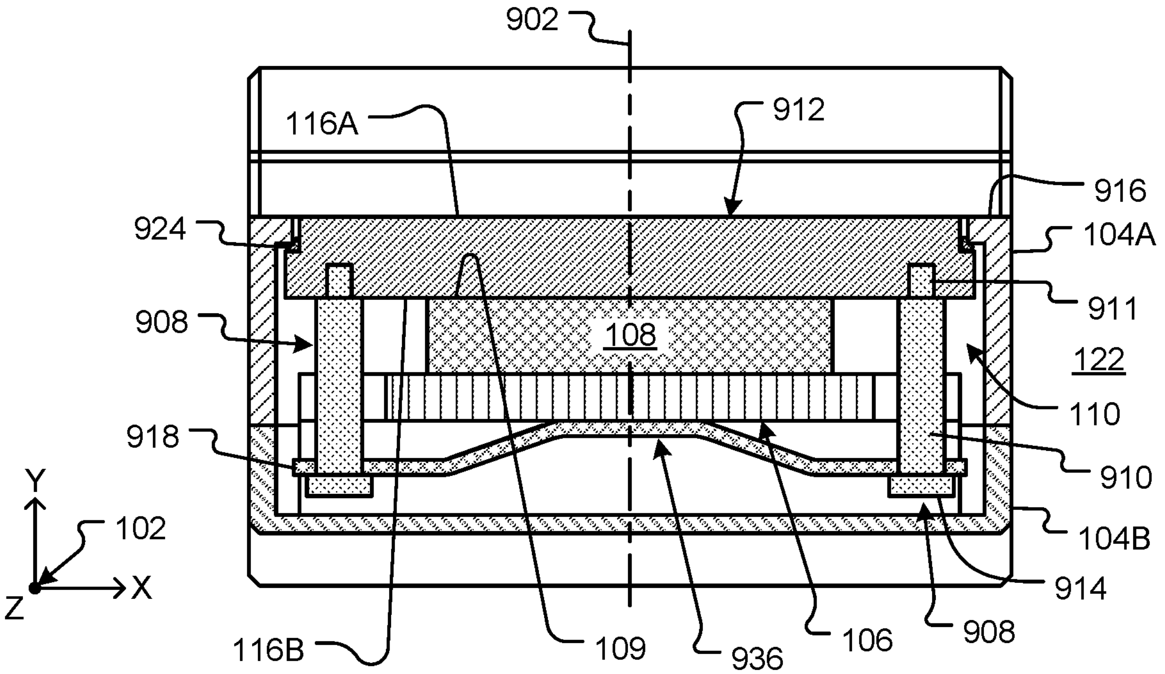
FIG. 9B shows a section view taken through line "9B-9B" of FIG. 9A in accordance with embodiments of the present disclosure.

Referring to FIGS. 9A and 9B, views of a pluggable network interface device 900 and components thereof are shown in accordance with embodiments of the present disclosure. The pluggable network interface device 900 may correspond to the pluggable network interface device 100 described in conjunction with FIGS. 1A-4. For instance, the pluggable network interface device 900 includes a heatsink 912 (e.g., similar, if not identical, to the heatsink 112) having a second surface 116B that is arranged in direct contact with the outer surface 109 of the heat-generating circuit package 108 of the circuit substrate 106. The pluggable network interface device 900 may include a fourth clamping arrangement between the heatsink 912 and the heat-generating circuit package 108.

A perspective view of the pluggable network interface device 900 is shown in FIG. 9A. The pluggable network interface device 900 may correspond to an RHS OSFP module. The pluggable network interface device 900 may include a plate type of spring 918 (e.g., leaf spring, etc.) that provides the clamp force between the heatsink 912 and the heat-generating circuit package 108.

As illustrated in the section view of FIG. 9B (taken through line "9B-9B" of FIG. 9A), the spring 918 may be configured as a bent, or shaped, plate including a contact bend 936 that engages with the circuit substrate 106 and two outer portions that engage with standoffs 908 that are attached to the heatsink 912. A first standoff 908 may be disposed on a first width side 150A of the heatsink 912 and a second standoff 908 may be disposed on a second width side 150B of the heatsink 912. A width portion of the circuit substrate 106 may be disposed between the two standoffs 908. The spring 918 may be configured as a plate extending from the one of the standoffs 908 to the other of the standoffs 908. The spring 918 may be attached, or fastened, to one standoff 908 at a first point and attached, or fastened, to a second standoff 908 at a second point. The spring 918 may include a bend (e.g., a contact bend 936) disposed between the first point and the second point that extends in a direction toward the circuit substrate 106. The contact bend 936 may contact the circuit substrate 106 at a center area of the circuit substrate 106 (e.g., disposed between the first point and the second point) along the centerline 902 of the pluggable network interface device 900. The contact bend 936 and the contact of the spring 918 with the standoffs 908 may maintain the second surface 116B in direct contact with the outer surface 109 of the at least one heat-generating circuit package 108 of the circuit substrate 106. In some embodiments, the pluggable network interface device 900 and/or the components thereof may be symmetrical about the centerline 902.

As illustrated in FIG. 9B, the spring 918 may provide the clamp force that biases, maintains, or clamps the heatsink 912 against the heat-generating circuit package 108 (e.g., in the negative Y-axis direction) such that the second surface 116B of the heatsink 912 is arranged in direct contact with the outer surface 109 of the heat-generating circuit package 108 of the circuit substrate 106. For example, the standoff 908 may correspond to a shoulder screw, machine screw, or fastener including a body 910 extending from a first end of the standoff 908 to a second end of the standoff 908. The body 910 may include a threaded portion 911 adjacent the second end of the standoff 908 and a cap portion 914 adjacent the first end of the standoff 908. In some embodiments, the body 910 of the standoff 908 may be configured as a cylindrical unthreaded portion. Each standoff 908 may be attached to the heatsink 912 via a threaded portion 911 threadedly engaging with a corresponding threaded hole disposed in the heatsink 912. The spring 918 may include clearance holes that engage with the body 910 of the standoff 908 and the cap portion 914 may compress the spring 918 (e.g., the contact bend 936) against the circuit substrate 106. While the clearance holes may allow the spring 918 to move in a direction along the positive Y-axis direction, the cap portion 914 may prevent movement of the spring 918 in the negative Y-axis direction. In some embodiments, the interface between the standoffs 908 and the clearance holes in the spring 918 may constrain movement of the spring 918 in the X-axis and Z-axis directions. In any event, the spring 918 maintains the second surface 116B of the heatsink 912 in direct contact with the outer surface 109 of the at least one heat-generating circuit package 108 of the circuit substrate 106 via a clamping force.

The pluggable network interface device 900 may include a compliant seal 924 that surrounds the periphery of the aperture 120. The compliant seal 924 may correspond to the compliant seal 208 described above. As illustrated in FIG. 9B, the compliant seal 924 is disposed between the heatsink 912 and the first shell portion 104A providing an airtight seal between the receiving cavity 110 and the exterior 122 of the housing 104.

The first surface 116A of the heatsink 912 may be arranged flush, or under flush, with the outermost height surface 916 of the pluggable network interface device 900. In some embodiments, the first surface 116A may be prevented from extending above the outermost height surface 916 of the pluggable network interface device 900 (e.g., in the Y-axis direction). Among other things, this arrangement may ensure that the dimensions of the pluggable network interface device 900 comport with OSFP standards (e.g., RHS OSFP module standards, etc.).

In each of the clamping arrangements described, the pluggable network interface devices 100, 500, 600, 700, 800, 900 described herein include a heatsink 112, 512, 612, 712, 812, 912, having a first surface 116A that is arranged adjacent the exterior 122 of the housing 104 and a second surface 116B that is arranged in direct contact with the outer surface 109 of the at least one heat-generating circuit package 108 of the circuit substrate 106. The pluggable network interface devices 100, 500, 600, 700, 800, 900 each include at least one spring 118, 518, 618, 718, 818, 918 that maintains a clamp force and the direct contact between the second surface 116B and the outer surface 109 of the heat-generating circuit package 108. In some embodiments, the pluggable network interface devices 100, 500, 600, 700, 800, 900 include a compliant seal 208, 524, 624, 724, 824, 924 arranged between a portion of the heatsinks 112, 512, 612, 712, 812, 912 and the aperture 120 of the first shell portion 104A of the housing 104. The compliant seals 208, 524, 624, 724, 824, 924 surround a periphery of the aperture 120 and a portion of the heatsinks 112, 512, 612, 712, 812, 912. Among other things, the compliant seals 208, 524, 624, 724, 824, 924 may be configured to form an airtight or watertight seal between the exterior 122 of the housing 104 and the receiving cavity 110 of the housing 104.

The exemplary systems and methods of this disclosure have been described in relation to the pluggable network interface devices, modules, and systems. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description. The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Exemplary aspects are directed to a pluggable network interface device, comprising: a PCB comprising at least one heat-generating circuit package; a heatsink comprising a first surface and a second surface disposed opposite the first surface, the first surface being offset a thickness from the second surface, and the second surface arranged in direct contact with an outer surface of the at least one heat-generating circuit package; and a housing comprising: an outer shell defining an exterior of the housing; a receiving cavity disposed inside the outer shell; and an aperture extending through a first side of the outer shell from the exterior of the housing into the receiving cavity; wherein a portion of the PCB and the second surface of the heatsink are both disposed inside the receiving cavity, and wherein a portion of the heatsink extends from within the receiving cavity through the aperture arranging the first surface of the heatsink adjacent the exterior of the housing.

Any one or more of the above aspects include wherein a compliant seal is disposed between the heatsink and the housing, and wherein the compliant seal surrounds a periphery of the aperture and the portion of the heatsink. Any one or more of the above aspects include wherein the compliant seal is compressed between the heatsink and the housing, and wherein the compliant seal forms an airtight seal between the exterior of the housing and the receiving cavity. Any one or more of the above aspects include wherein the compliant seal is a thermal putty material. Any one or more of the above aspects include a spring arranged in contact with the heatsink, the spring maintaining a clamp force and the direct contact between the second surface of the heatsink and the outer surface of the at least one heat-generating circuit package. Any one or more of the above aspects include a fastener comprising a body extending from a first end of the fastener to a second end of the fastener, the body comprising a threaded portion adjacent the second end of the fastener and a cap portion adjacent the first end of the fastener, the threaded portion threadedly engaged with the housing, wherein the spring is configured as a compression spring, wherein the compression spring surrounds the body of the fastener, wherein the compression spring is disposed in a compressed state between the cap portion of the fastener and the heatsink, and wherein the compression spring maintains the second surface in direct contact with the outer surface of the at least one heat-generating circuit package. Any one or more of the above aspects include wherein herein the spring is configured as a spring clip, comprising: a first leg comprising a first slot; a second leg comprising a second slot, the second leg disposed offset a width distance from the first leg; and a center spring contact portion disposed between and joining the first leg and the second leg, wherein the first slot of the spring clip engages with a first tab of the heatsink, wherein the second slot of the spring clip engages with a second tab of the heatsink, wherein the first tab of the heatsink and the second tab of the heatsink are arranged on opposite width sides of the heatsink, wherein a center portion of the spring clip contacts the PCB, and wherein the center portion of the spring clip contacting the PCB maintains the second surface in direct contact with the outer surface of the at least one heat-generating circuit package. Any one or more of the above aspects include a first standoff disposed on a first width side of the heatsink; a second standoff disposed on a second width side of the heatsink, wherein the first width side is offset a distance from the second width side, and wherein a width portion of the PCB is disposed between the first standoff and the second standoff; and the spring being configured as a plate extending from the first standoff to the second standoff, the plate fastened to the first standoff at a first point and fastened to the second standoff at a second point, the plate comprising a bend disposed between the first point and the second point, wherein the bend extends in a direction toward the PCB contacting the PCB at a center area disposed between the first point and the second point, and wherein the bend contacting the PCB maintains the second surface in direct contact with the outer surface of the at least one heat-generating circuit package. Any one or more of the above aspects include wherein the pluggable network interface device comprises an overall outermost height and an overall outermost width, and wherein the first surface of the heatsink is in a plane of a surface of the overall outermost height or under the plane of a surface of the overall outermost height. Any one or more of the above aspects include wherein the housing further comprises: a first outer shell portion extending a first length and comprising a first cavity running along a portion of the first length, wherein the aperture extends through the first side of the first outer shell portion; and a second outer shell portion extending the first length and comprising a second cavity running along the portion of the first length, wherein the first outer shell portion is joined to the second outer shell portion, and wherein the first cavity and the second cavity together form the receiving cavity for the housing.

Exemplary aspects are directed to a pluggable network interface module, comprising: a split-shell housing running a first length from a first end of the split-shell housing to a second end of the split-shell housing, the split-shell housing comprising: a first shell portion extending the first length and comprising a first cavity running along a portion of the first length; a second shell portion extending the first length and comprising a second cavity running along a portion of the first length, wherein the first shell portion is joined to the second shell portion, and wherein the first cavity and the second cavity together form a receiving cavity for the split-shell housing; and an aperture extending through a first side of the first shell portion from the receiving cavity to an exterior of the split-shell housing; a circuit substrate disposed at least partially within the receiving cavity, the circuit substrate comprising at least one heat-generating element; and a heatsink comprising a first surface and a second surface disposed opposite the first surface, the first surface being offset a thickness from the second surface, and the second surface arranged in direct contact with an outer surface of the at least one heat-generating element, wherein the second surface of the heatsink is disposed inside the receiving cavity, and wherein a portion of the heatsink extends from within the receiving cavity through the aperture arranging the first surface of the heatsink adjacent the exterior of the first shell portion of the split-shell housing.

Any one or more of the above aspects include a compliant gasket material disposed between the heatsink and the first shell portion of the split-shell housing, wherein the compliant gasket material surrounds a periphery of the aperture and the portion of the heatsink. Any one or more of the above aspects include wherein the compliant gasket material is compressed between the heatsink and the first shell portion of the split-shell housing, and wherein the compliant gasket material forms an airtight seal between the exterior of the split-shell housing and the receiving cavity. Any one or more of the above aspects include wherein the compliant gasket material is a gel thermal interface material. Any one or more of the above aspects include a spring arranged in contact with the heatsink, the spring maintaining the direct contact between the second surface of the heatsink and the outer surface of the at least one heat-generating element. Any one or more of the above aspects include wherein the spring is physically attached to the heatsink by at least one of a fastener and a slot-and-tab interface.

Exemplary aspects are directed to a pluggable network interface module, comprising: a split-shell housing running a first length from a first end of the split-shell housing to a second end of the split-shell housing, the split-shell housing comprising: a first shell portion extending the first length and comprising a first cavity running along a portion of the first length; a second shell portion extending the first length and comprising a second cavity running along a portion of the first length, wherein the first shell portion is joined to the second shell portion, and wherein the first cavity and the second cavity together form a receiving cavity for the split-shell housing; and an aperture extending through a first side of the first shell portion from the receiving cavity to an exterior of the split-shell housing; a circuit substrate disposed at least partially within the receiving cavity, the circuit substrate comprising at least one heat-generating element; a heatsink comprising a first surface and a second surface disposed opposite the first surface, the first surface being offset a thickness from the second surface, and the second surface arranged in direct contact with an outer surface of the at least one heat-generating element, wherein the second surface of the heatsink is disposed inside the receiving cavity, and wherein a portion of the heatsink extends from within the receiving cavity through the aperture arranging the first surface of the heatsink adjacent the exterior of the first shell portion of the split-shell housing; and a spring arranged in contact with the heatsink, the spring maintaining the direct contact between the second surface of the heatsink and the outer surface of the at least one heat-generating element.

Any one or more of the above aspects include wherein the spring is configured as a spring clip, comprising: a first leg comprising a first slot; a second leg comprising a second slot, the second leg disposed offset a width distance from the first leg; and a center spring contact portion disposed between and joining the first leg and the second leg, wherein the first slot of the spring clip engages with a first tab of the heatsink, wherein the second slot of the spring clip engages with a second tab of the heatsink, wherein the first tab of the heatsink and the second tab of the heatsink are arranged on opposite width sides of the heatsink, wherein a center portion of the spring clip contacts the circuit substrate, and wherein the center portion of the spring clip contacting the circuit substrate maintains the second surface in direct contact with the outer surface of the at least one heat-generating element. Any one or more of the above aspects include a first standoff disposed on a first width side of the heatsink; a second standoff disposed on a second width side of the heatsink, wherein the first width side is offset a distance from the second width side, and wherein a width portion of the circuit substrate is disposed between the first standoff and the second standoff; and the spring being configured as a plate extending from the first standoff to the second standoff, the plate fastened to the first standoff at a first point and fastened to the second standoff at a second point, the plate comprising a bend disposed between the first point and the second point, wherein the bend extends in a direction toward the circuit substrate contacting the circuit substrate at a center area disposed between the first point and the second point, and wherein the bend contacting the circuit substrate maintains the second surface in direct contact with the outer surface of the at least one heat-generating element. Any one or more of the above aspects include wherein the pluggable network interface module is an OSFP device.

Any one or more of the above aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

Any one or more of the features disclosed herein.

Any one or more of the features as substantially disclosed herein.

Any one or more of the features as substantially disclosed herein in combination with any one or more other features as substantially disclosed herein.

Any one of the aspects/features/embodiments in combination with any one or more other aspects/features/embodiments.

Use of any one or more of the aspects or features as disclosed herein.

It is to be appreciated that any feature described herein can be claimed in combination with any other feature(s) as described herein, regardless of whether the features come from the same described embodiment.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together. When each one of A, B, and C in the above expressions refers to an element, such as X, Y, and Z, or a class of elements, such as X1-Xn, Y1-Ym, and Z1-Zo, the phrase is intended to refer to a single element selected from X, Y, and Z, a combination of elements selected from the same class (e.g., X1 and X2) as well as a combination of elements selected from two or more classes (e.g., Y1 and Zo).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein.

What is claimed is:

1. A pluggable network interface device, comprising:

a printed circuit board (PCB) comprising at least one heat-generating circuit package;

a heatsink comprising a first surface and a second surface disposed opposite the first surface, the first surface being offset a thickness from the second surface, and the second surface arranged in direct contact with an outer surface of the at least one heat-generating circuit package; and a housing comprising:

an outer shell defining an exterior of the housing;

a receiving cavity disposed inside the outer shell; and an aperture extending through a first side of the outer shell from the exterior of the housing into the receiving cavity;

wherein a portion of the PCB and the second surface of the heatsink are both disposed inside the receiving cavity, and wherein a portion of the heatsink extends from within the receiving cavity through the aperture arranging the first surface of the heatsink adjacent the exterior of the housing.

2. The pluggable network interface device of claim 1, further comprising:

a compliant seal disposed between the heatsink and the housing, wherein the compliant seal surrounds a periphery of the aperture and the portion of the heatsink.

3. The pluggable network interface device of claim 2, wherein the compliant seal is compressed between the heatsink and the housing, and wherein the compliant seal forms an airtight seal between the exterior of the housing and the receiving cavity.

4. The pluggable network interface device of claim 3, wherein the compliant seal is a thermal putty material.

5. The pluggable network interface device of claim 1, further comprising:

a spring arranged in contact with the heatsink, the spring maintaining a clamp force and the direct contact between the second surface of the heatsink and the outer surface of the at least one heat-generating circuit package.

6. The pluggable network interface device of claim 5, further comprising:

a fastener comprising a body extending from a first end of the fastener to a second end of the fastener, the body comprising a threaded portion adjacent the second end of the fastener and a cap portion adjacent the first end of the fastener, the threaded portion threadedly engaged with the housing, wherein the spring is configured as a compression spring, wherein the compression spring surrounds the body of the fastener, wherein the compression spring is disposed in a compressed state between the cap portion of the fastener and the heatsink, and wherein the compression spring maintains the second surface in direct contact with the outer surface of the at least one heat-generating circuit package.

7. The pluggable network interface device of claim 5, wherein the spring is configured as a spring clip, comprising:

a first leg comprising a first slot;

a second leg comprising a second slot, the second leg disposed offset a width distance from the first leg; and a center spring contact portion disposed between and joining the first leg and the second leg, wherein the first slot of the spring clip engages with a first tab of the heatsink, wherein the second slot of the spring clip engages with a second tab of the heatsink, wherein the first tab of the heatsink and the second tab of the heatsink are arranged on opposite width sides of the heatsink, wherein the center spring contact portion of the spring clip contacts the PCB and maintains the second surface in direct contact with the outer surface of the at least one heat-generating circuit package.

8. The pluggable network interface device of claim 5, further comprising:

a first standoff disposed on a first width side of the heatsink;

a second standoff disposed on a second width side of the heatsink, wherein the first width side is offset a distance from the second width side, and wherein a width portion of the PCB is disposed between the first standoff and the second standoff; and the spring being configured as a plate extending from the first standoff to the second standoff, the plate fastened to the first standoff at a first point and fastened to the second standoff at a second point, the plate comprising a bend disposed between the first point and the second point, wherein the bend extends in a direction toward the PCB contacting the PCB at a center area disposed between the first point and the second point, and wherein the bend contacting the PCB maintains the second surface in direct contact with the outer surface of the at least one heat-generating circuit package.

9. The pluggable network interface device of claim 1, wherein the pluggable network interface device comprises an overall outermost height and an overall outermost width, and wherein the first surface of the heatsink is in a plane of a surface of the overall outermost height or under the plane of a surface of the overall outermost height.

10. The pluggable network interface device of claim 1, wherein the housing further comprises:

a first outer shell portion extending a first length and comprising a first cavity running along a portion of the first length, wherein the aperture extends through the first side of the first outer shell portion; and a second outer shell portion extending the first length and comprising a second cavity running along the portion of the first length, wherein the first outer shell portion is joined to the second outer shell portion, and wherein the first cavity and the second cavity together form the receiving cavity for the housing.

11. A pluggable network interface module, comprising:

a split-shell housing running a first length from a first end of the split-shell housing to a second end of the split-shell housing, the split-shell housing comprising:

a first shell portion extending the first length and comprising a first cavity running along a portion of the first length;

a second shell portion extending the first length and comprising a second cavity running along a portion of the first length, wherein the first shell portion is joined to the second shell portion, and wherein the first cavity and the second cavity together form a receiving cavity for the split-shell housing; and an aperture extending through a first side of the first shell portion from the receiving cavity to an exterior of the split-shell housing;

a circuit substrate disposed at least partially within the receiving cavity, the circuit substrate comprising at least one heat-generating element; and a heatsink comprising a first surface and a second surface disposed opposite the first surface, the first surface being offset a thickness from the second surface, and the second surface arranged in direct contact with an outer surface of the at least one heat-generating element, wherein the second surface of the heatsink is disposed inside the receiving cavity, and wherein a portion of the heatsink extends from within the receiving cavity through the aperture arranging the first surface of the heatsink adjacent the exterior of the first shell portion of the split-shell housing.

12. The pluggable network interface module of claim 11, further comprising:

a compliant gasket material disposed between the heatsink and the first shell portion of the split-shell housing, wherein the compliant gasket material surrounds a periphery of the aperture and the portion of the heatsink.

13. The pluggable network interface module of claim 12, wherein the compliant gasket material is compressed between the heatsink and the first shell portion of the split-shell housing, and wherein the compliant gasket material forms an airtight seal between the exterior of the split-shell housing and the receiving cavity.

14. The pluggable network interface module of claim 12, wherein the compliant gasket material is a gel thermal interface material.

15. The pluggable network interface module of claim 11, further comprising:

a spring arranged in contact with the heatsink, the spring maintaining the direct contact between the second surface of the heatsink and the outer surface of the at least one heat-generating element.

16. The pluggable network interface module of claim 15, wherein the spring is physically attached to the heatsink by at least one of a fastener and a slot-and-tab interface.

17. A pluggable network interface module, comprising:

a split-shell housing running a first length from a first end of the split-shell housing to a second end of the split-shell housing, the split-shell housing comprising:

a first shell portion extending the first length and comprising a first cavity running along a portion of the first length;

a second shell portion extending the first length and comprising a second cavity running along a portion of the first length, wherein the first shell portion is joined to the second shell portion, and wherein the first cavity and the second cavity together form a receiving cavity for the split-shell housing; and an aperture extending through a first side of the first shell portion from the receiving cavity to an exterior of the split-shell housing;

a circuit substrate disposed at least partially within the receiving cavity, the circuit substrate comprising at least one heat-generating element;

a heatsink comprising a first surface and a second surface disposed opposite the first surface, the first surface being offset a thickness from the second surface, and the second surface arranged in direct contact with an outer surface of the at least one heat-generating element, wherein the second surface of the heatsink is disposed inside the receiving cavity, and wherein a portion of the heatsink extends from within the receiving cavity through the aperture arranging the first surface of the heatsink adjacent the exterior of the first shell portion of the split-shell housing; and a spring arranged in contact with the heatsink, the spring maintaining the direct contact between the second surface of the heatsink and the outer surface of the at least one heat-generating element.

18. The pluggable network interface module of claim 17, wherein the spring is configured as a spring clip, comprising:

a first leg comprising a first slot;

a second leg comprising a second slot, the second leg disposed offset a width distance from the first leg; and a center spring contact portion disposed between and joining the first leg and the second leg, wherein the first slot of the spring clip engages with a first tab of the heatsink, wherein the second slot of the spring clip engages with a second tab of the heatsink, wherein the first tab of the heatsink and the second tab of the heatsink are arranged on opposite width sides of the heatsink, wherein the center spring contact portion of the spring clip contacts the circuit substrate and maintains the second surface in direct contact with the outer surface of the at least one heat-generating element.

19. The pluggable network interface module of claim 17, further comprising:

a first standoff disposed on a first width side of the heatsink;

a second standoff disposed on a second width side of the heatsink, wherein the first width side is offset a distance from the second width side, and wherein a width portion of the circuit substrate is disposed between the first standoff and the second standoff; and the spring being configured as a plate extending from the first standoff to the second standoff, the plate fastened to the first standoff at a first point and fastened to the second standoff at a second point, the plate comprising a bend disposed between the first point and the second point, wherein the bend extends in a direction toward the circuit substrate contacting the circuit substrate at a center area disposed between the first point and the second point, and wherein the bend contacting the circuit substrate maintains the second surface in direct contact with the outer surface of the at least one heat-generating element.

20. The pluggable network interface module of claim 17, wherein the pluggable network interface module is an octal small form-factor pluggable (OSFP) device.

* * * * *